(12) United States Patent
Cho et al.

(10) Patent No.: US 9,087,789 B2
(45) Date of Patent: Jul. 21, 2015

(54) METHODS OF MANUFACTURING A SEMICONDUCTOR DEVICE

(71) Applicant: Samsung Electronics Co., Ltd., Suwon-si (KR)

(72) Inventors: HanNa Cho, Incheon (KR); Dongseok Lee, Wappingers Falls, NY (US); Jungpyo Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 13/728,277

(22) Filed: Dec. 27, 2012

(65) Prior Publication Data

US 2013/0164922 A1  Jun. 27, 2013

(30) Foreign Application Priority Data

Dec. 27, 2011 (KR) .................... 10-2011-0143409

(51) Int. Cl.

| H01L 21/00 | (2006.01) |
|---|---|
| H01L 21/308 | (2006.01) |
| H01L 21/04 | (2006.01) |
| H01L 21/033 | (2006.01) |
| H01L 21/311 | (2006.01) |
| H01L 21/3213 | (2006.01) |
| H01L 29/66 | (2006.01) |
| H01L 27/115 | (2006.01) |
| H01L 49/02 | (2006.01) |

(52) U.S. Cl.
CPC .......... *H01L 21/308* (2013.01); *H01L 21/0337* (2013.01); *H01L 21/04* (2013.01); *H01L 21/31144* (2013.01); *H01L 21/32137* (2013.01); *H01L 29/66545* (2013.01); *H01L 29/66825* (2013.01); *H01L 27/11582* (2013.01); *H01L 28/90* (2013.01)

(58) Field of Classification Search
CPC ............ H01L 21/308; H01L 21/31144; H01L 29/66825; H01L 27/11582; H01L 28/90; H01L 29/66545
USPC .................................................. 438/268–270
See application file for complete search history.

(56) References Cited

U.S. PATENT DOCUMENTS

| 5,656,128 | A | * | 8/1997 | Hashimoto et al. ............. 216/47 |
|---|---|---|---|---|
| 6,764,949 | B2 | | 7/2004 | Bonser et al. |
| 6,797,552 | B1 | * | 9/2004 | Chang et al. .................. 438/197 |
| 7,105,431 | B2 | | 9/2006 | Yin et al. |
| 8,445,317 | B2 | * | 5/2013 | Jeong et al. ..................... 438/99 |
| 8,536,065 | B2 | * | 9/2013 | Seamons et al. ............. 438/761 |
| 2004/0259355 | A1 | | 12/2004 | Yin et al. |
| 2005/0056940 | A1 | | 3/2005 | Sandhu et al. |
| 2009/0286403 | A1 | | 11/2009 | Kim et al. |

FOREIGN PATENT DOCUMENTS

| JP | 2009-283674 | 12/2009 |
|---|---|---|
| KR | 100772706 B1 | 10/2007 |

(Continued)

*Primary Examiner* — Richard Booth
(74) *Attorney, Agent, or Firm* — Myers Bigel Sibley & Sajovec, PA

(57) ABSTRACT

Methods of manufacturing a semiconductor device are provided. The method may include forming an etch target layer on a substrate, forming a carbon layer doped with boron on the etch target layer, a top end portion of the carbon layer having a different boron concentration from a bottom end portion of the carbon layer, patterning the carbon layer to form at least one opening exposing the etch target layer, and etching the exposed etch target layer using the carbon layer as an etch mask.

18 Claims, 24 Drawing Sheets

(56) References Cited

FOREIGN PATENT DOCUMENTS

| | | |
|---|---|---|
| KR | 1020090001196 A | 1/2009 |
| KR | 1020090042437 A | 4/2009 |
| KR | 1020090070687 A | 7/2009 |
| KR | 1020090095749 A | 9/2009 |

* cited by examiner

METHODS OF MANUFACTURING A SEMICONDUCTOR DEVICE

CROSS-REFERENCE TO RELATED APPLICATIONS

This U.S. non-provisional patent application claims priority under 35 U.S.C. §119 to Korean Patent Application No. 10-2011-0143409, filed on Dec. 27, 2011, the entirety of which is incorporated by reference herein.

BACKGROUND

The inventive concept relates to methods of manufacturing a semiconductor device and, more particularly, to methods of manufacturing a semiconductor device including a deep-etched region.

Semiconductor devices are very attractive in an electronic industry because of their small size, multi-function capabilities, and/or low fabrication costs. As the semiconductor devices become more highly integrated, widths of patterns in the semiconductor devices and spaces between the patterns are being reduced. Additionally, because a planar area of the semiconductor device is limited by the high integration, vertical heights of the patterns may increase. Thus, in an etching process forming the patterns, an aspect ratio of an etched region may increase and a thickness of an etched layer may increase. Therefore, various problems may occur during the manufacture of the semiconductor devices.

SUMMARY

Embodiments of the inventive concept are directed to methods of manufacturing a semiconductor device.

According to embodiments of the inventive concept, a method of manufacturing a semiconductor device may include: forming an etch target layer on a substrate; forming a carbon layer doped with boron on the etch target layer, a top end portion of the carbon layer having a different boron concentration from a bottom end portion of the carbon layer; patterning the carbon layer to form at least one opening exposing the etch target layer; and etching the exposed etch target layer using the carbon layer as an etch mask.

In some embodiments, the carbon layer may be in an amorphous state.

In other embodiments, the boron concentration of the top end portion of the carbon layer may be greater than the boron concentration of the bottom end portion of the carbon layer.

In still other embodiments, the boron concentration of the carbon layer may gradually increase from a bottom surface of the carbon layer toward a top surface of the carbon layer.

In yet other embodiments, the boron concentration of the carbon layer may stepwise increase from a bottom surface of the carbon layer toward a top surface of the carbon layer. In this case, the carbon layer may include a plurality of sub-layers sequentially stacked. A boron concentration of each of the sub-layers may be substantially uniform in each of the sub-layers, and a boron concentration of a relatively high sub-layer may be greater than a boron concentration of a relatively low sub-layer in the plurality of sub-layers.

In yet still other embodiments, at least the top end portion of the carbon layer may be removed for etching the etch target layer. In this case, the method may further include: after etching the etch target layer, removing a residual portion of the carbon layer by an ashing process.

In yet still other embodiments, the top end portion of the carbon layer may have a greater transmittance than the bottom end portion of the carbon layer.

In yet still other embodiments, a bowing profile may be formed after etching the etch target layer. A region having a maximum width of the bowing profile may be formed in the opening penetrating the carbon layer.

In yet still other embodiments, the method may further include: before forming the carbon layer, forming an assistant mask layer on the etch target layer. In this case, patterning the carbon layer may include successively patterning the carbon layer and the assistant mask layer to form an opening exposing the etch target layer. An etch rate of the assistant mask layer may be lower than an etch rate of the etch target layer in a process etching the etch target layer.

In yet still other embodiments, patterning the carbon layer may include: forming an inorganic mask layer on the carbon layer; forming an organic mask layer on the inorganic mask layer; patterning the organic mask layer by a photolithography process to form a mask-opening exposing the inorganic mask layer; etching the exposed inorganic mask layer using the organic mask layer as an etch mask to expose the carbon layer; and etching the exposed carbon layer to form the opening.

In yet still other embodiments, the etch target layer may include at least two layers respectively including different materials from each other.

In yet still other embodiments, the etch target layer may include insulating layers and sacrificial layers that are alternately and repeatedly stacked, and a hole may be formed by etching the etch target layer. In this case, the method may further include: removing the carbon layer after forming the hole; forming a vertical active pattern in the hole; patterning the etch target layer provided with the vertical active pattern to form a mold pattern including the vertical active pattern, the mold pattern including the insulating patterns and the sacrificial patterns alternately and repeatedly stacked; removing the sacrificial patterns to form empty regions; forming gate electrodes in the empty regions, respectively; and forming a gate dielectric layer between each of the gate electrodes and the vertical active pattern.

In yet still other embodiments, forming the mold pattern may include: forming a second carbon layer doped with boron on the etch target layer including the vertical active pattern, a top end portion of the second carbon layer having a greater boron concentration than a bottom end portion of the second carbon layer; patterning the second carbon layer to form second openings exposing the etch target layer; and etching the exposed etch target layer using the second carbon layer as an etch mask to form trenches and the mold pattern between the trenches.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
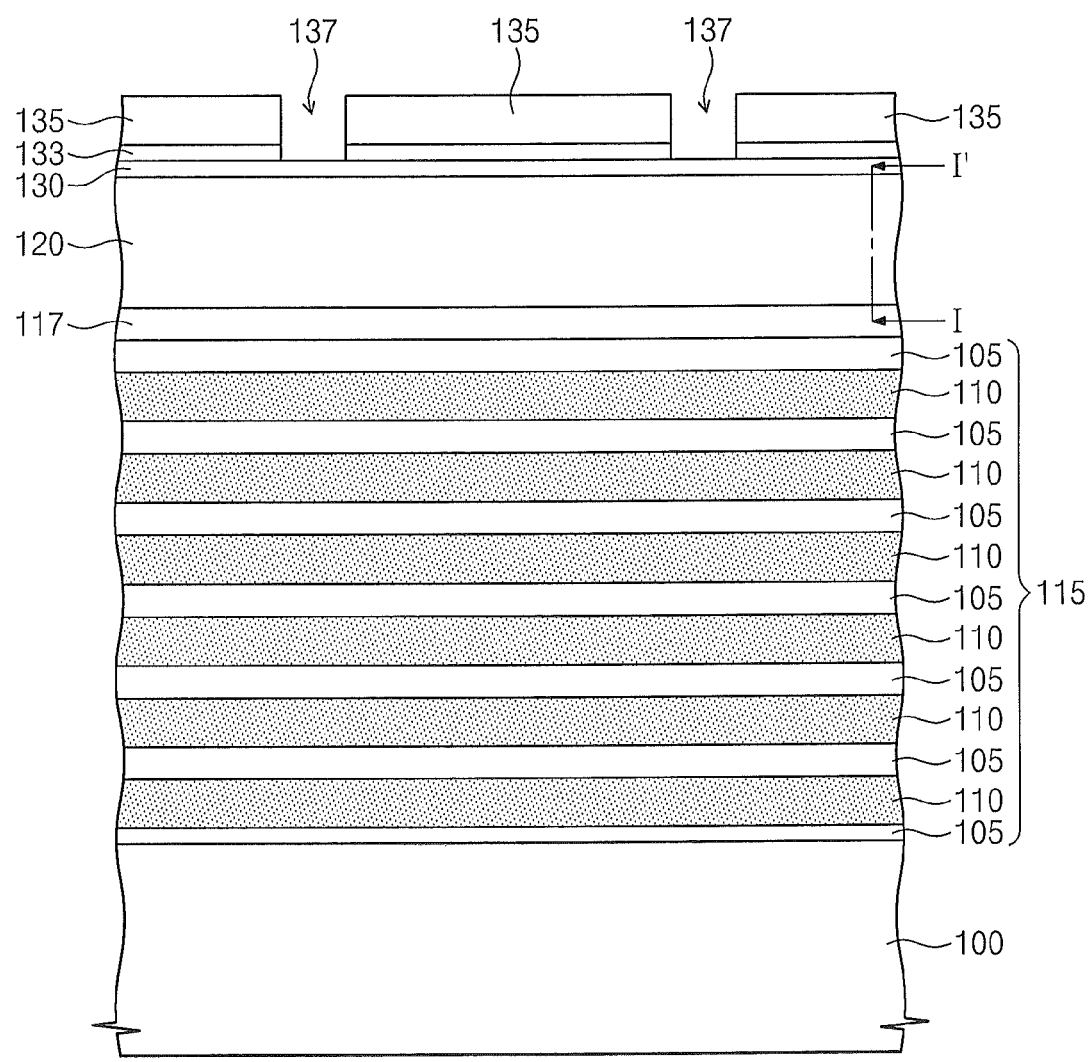
FIGS. 1 and 5 to 13 are cross-sectional views illustrating a method of manufacturing a semiconductor device according to a first embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shapes illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
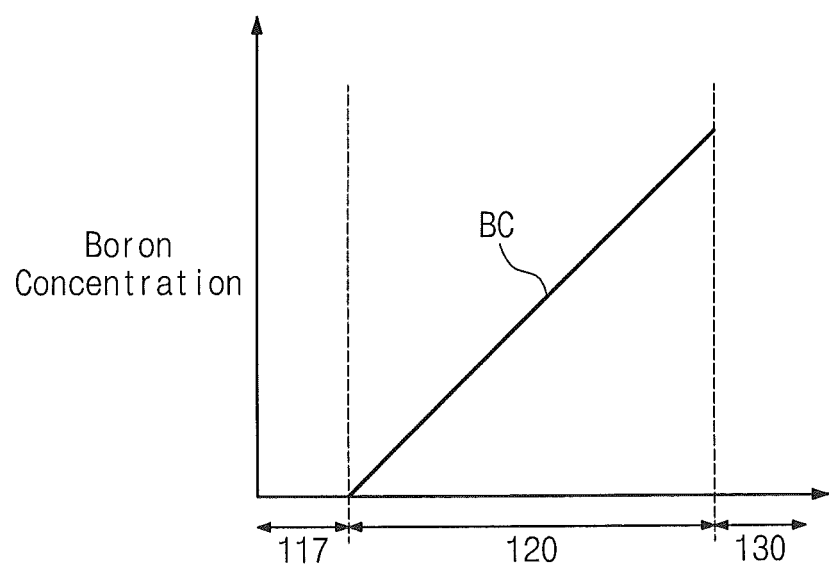
FIG. 2 is a graph taken along a line I-I' of FIG. 1 to illustrate a boron concentration in a carbon layer according to some embodiments of the inventive concept.
Figure 3:
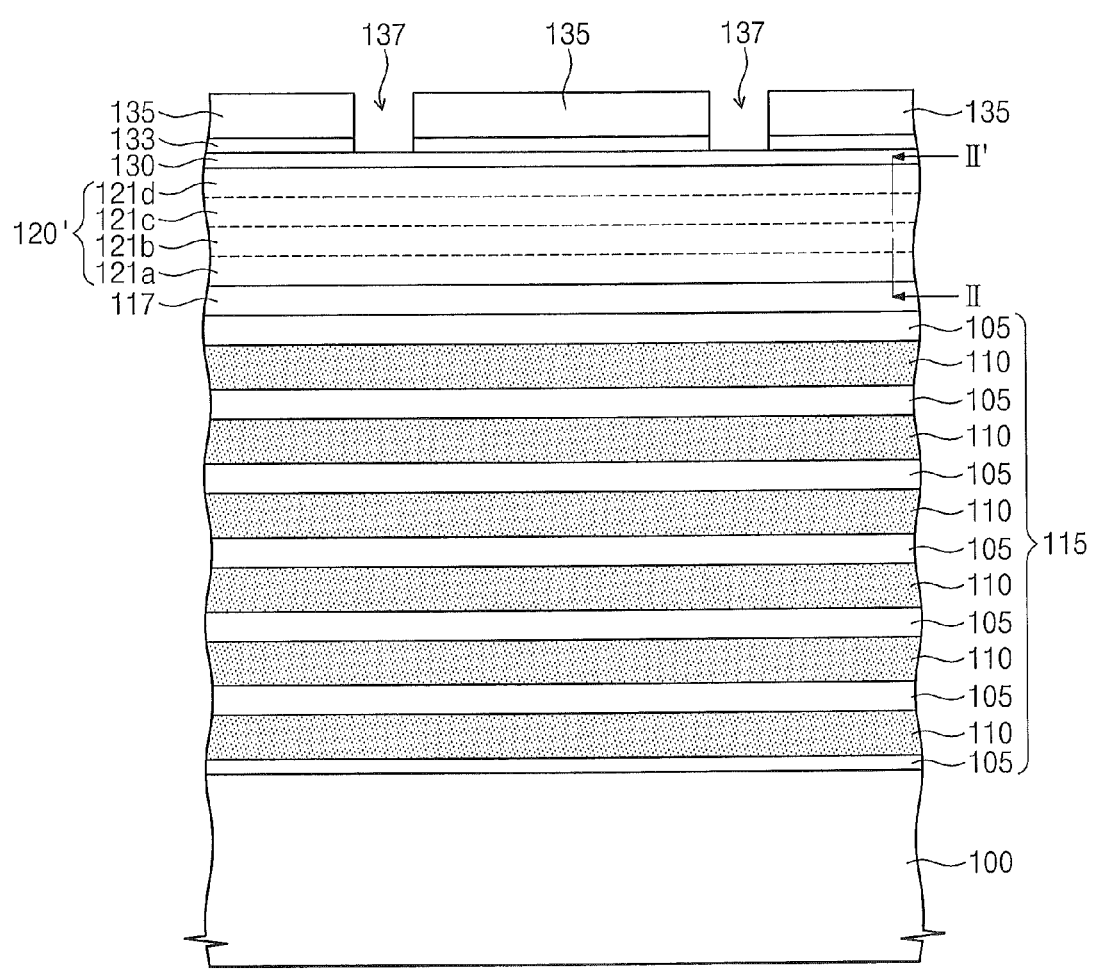
FIG. 3 is a cross-sectional view illustrating a carbon layer according to other embodiments of the inventive concept.
Figure 4:
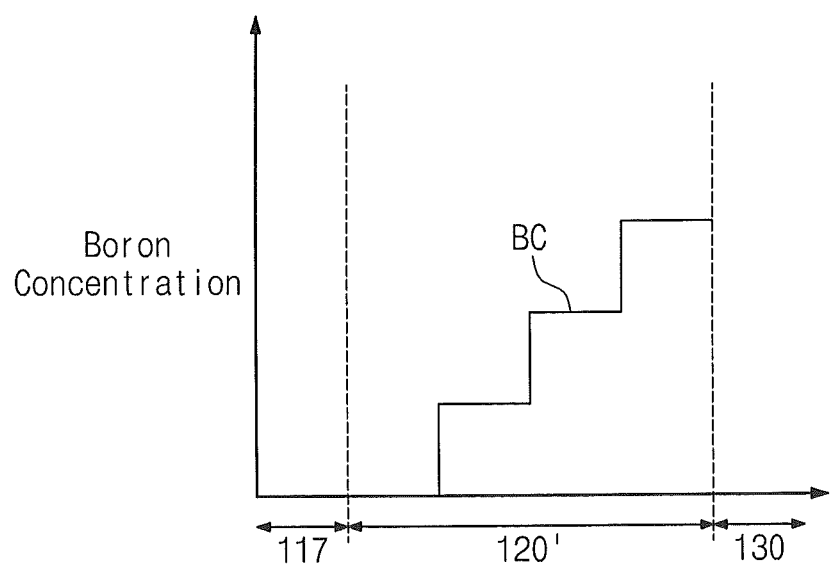
FIG. 4 is a graph taken along a line I-I' of FIG. 1 to illustrate a boron concentration in a carbon layer according to other embodiments of the inventive concept.

FIGS. 1 and 5 to 13 are cross-sectional views illustrating a method of manufacturing a semiconductor device according to a first embodiment of the inventive concept. FIG. 2 is a graph taken along a line I-I' of FIG. 1 to describe a boron concentration in a carbon layer according to some embodiments of the inventive concept. FIG. 3 is a cross-sectional view illustrating a carbon layer according to other embodiments of the inventive concept. FIG. 4 is a graph taken along a line I-I' of FIG. 1 to describe a boron concentration in a carbon layer according to other embodiments of the inventive concept.

Referring to FIG. 1, an etch target layer 115 may be formed on a substrate 100. The substrate 100 may include a silicon substrate, a germanium substrate, or a silicon-germanium substrate. The substrate 100 may be doped with dopants of a first conductivity type. In some embodiments, the etch target layer 115 may include at least two layers that are formed of materials different from each other, respectively. For example, in the present embodiment, the etch target layer 115 may include insulating layers 105 and sacrificial layers 110 that are alternately and repeatedly stacked. The sacrificial layers 110 may be formed of a material having an etch selectivity with respect to the insulating layers 105. For example, the insulating layers 105 may be formed of oxide layers (e.g. silicon oxide layers) and the sacrificial layers 110 may be formed of nitride layers (e.g. silicon nitride layers). However, the inventive concept is not limited to the etch target layer 115 described above. In other embodiments, the etch target layer 115 may be a single-layer. In still other embodiments, the etch target layer 115 may include three or more layers respectively formed of materials different form each other.

An assistant mask layer 117 may be formed on the etch target layer 115. The assistant mask layer 117 may be formed of a material having an etch selectivity with respect to the etch target layer 115. In some embodiments, the assistant mask layer 117 may be formed of a material having an etch selectivity with respect to the insulating layer 105 and the sacrificial layers 110. Particularly, the assistant mask layer 117 may have a greater hardness than the etch target layer 115. For example, the assistant mask layer 117 may be formed of poly-silicon. In other embodiments, the assistant mask layer 117 may be omitted.

A carbon layer 120 may be formed on the assistant mask layer 117. The carbon layer 120 is in an amorphous state. The carbon layer 120 is doped with boron. Here, a boron concentration of a top end portion of the carbon layer 120 is different from a boron concentration of a bottom end portion of the carbon layer 120. In some embodiments, the boron concentration of the top end portion of the carbon layer 120 may be greater than the boron concentration of the bottom end portion of the carbon layer 120. The carbon layer 120 has an etch selectivity with respect to the etch target layer 115 and the assistant mask layer 117. In other words, the carbon layer 120 functions as a hard mask layer.

Because the boron concentration of the top end portion of the carbon layer 120 is greater than the boron concentration of the bottom end portion of the carbon layer 120, the top end portion of the carbon layer 120 may have a greater hardness than the bottom end portion of the carbon layer 120. Thus, an etch selectivity ratio of the top end portion of the carbon layer 120 with respect to the etch target layer 115 may be greater than an etch selectivity ratio of the bottom end portion of the carbon layer 120 with respect to the etch target layer 115. Additionally, because the top end portion of the carbon layer 120 has the greater boron concentration than the bottom end portion of the carbon layer 120, a transmittance of the top end portion of the carbon layer 120 may be greater than a transmittance of the bottom end portion of the carbon layer 120.

In some embodiments, as illustrated in FIG. 2, the boron concentration BC in the carbon layer 120 may become gradually increased from a bottom surface of the carbon layer 120 toward a top surface of the carbon layer 120. The boron concentration of the bottom surface of the carbon layer 120 may be the minimum in the carbon layer 120. In some embodiments, the boron concentration of the bottom surface of the carbon layer 120 may be approximately zero. Alternatively, the boron concentration of the bottom surface of the carbon layer 120 may have a predetermined value. The boron concentration of the top surface of the carbon layer 120 may be the maximum in the carbon layer 120.

The carbon layer 120 may be formed by a chemical vapor deposition (CVD) process or a physical vapor deposition (PVD) process. Here, the carbon layer 120 may be formed in-situ and the carbon layer 120 may be doped with boron in-situ. For example, when the carbon layer 120 is formed by the CVD process using a carbon source gas and a boron source gas, an inflow rate of the boron source gas may be gradually increased. Thus, the carbon layer 120 may be formed to have the gradually increased boron concentration BC. For another example, when the carbon layer 120 is formed by the PVD process using a carbon target, the boron source gas may flow into a chamber where the PVD process is performed, and the amount of the boron source gas may be gradually increased.

Meanwhile, according to other embodiments of the inventive concept, the boron concentration of the carbon layer may have another profile. As illustrated in FIGS. 3 and 4, a boron concentration BC in a carbon layer 120' may be stepwise increased from a bottom surface of the carbon layer 120' toward a top surface of the carbon layer 120'. In more detail, the carbon layer 120' may include a plurality of sub-layers 121a, 121b, 121c, and 121d sequentially stacked. A boron concentration of each of the sub-layers 121a, 121b, 121c, and 121d may be substantially uniform therein. Here, the boron concentration of a relatively high sub-layer may be greater than the boron concentration of a relatively low sub-layer in the plurality of sub-layers 121a, 121b, 121c, and 121d. The boron concentration of the uppermost sub-layer 121d may be the maximum in the plurality of sub-layers 121a, 121b, 121c, and 121d and the boron concentration of the lowermost sub-layer 121a may be the minimum in the plurality of sub-layers 121a, 121b, 121c, and 121d. The boron concentration of the lowermost sub-layer 121a may be approximately zero or a predetermined value.

The carbon layer 120' may be formed by a CVD process or a PVD process. The sub-layers 121a, 121b, 121c, and 121d of the carbon layer 120' may be formed in-situ and be doped in-situ. For example, if the carbon layer 120' is formed by the CVD process using a carbon source gas and a boron source gas, an inflow rate of the boron source gas may be stepwise increased. Thus, the carbon layer 120' having the stepwise increased boron concentration BC may be formed. For another example, if the carbon layer 120' is formed by the PVD process using a carbon target, a boron source gas may flow into a chamber where the PVD is performed and the amount of the boron source gas may be stepwise increased.

Hereinafter, for the purpose of ease and convenience in explanation, the manufacturing methods according to embodiments of the inventive concept will be described using the carbon layer 120 of FIGS. 1 and 2 as an example. However, the inventive concept is not limited thereto. The carbon layer 120' may be applied to the manufacturing methods described below.

Referring to FIG. 1 again, an inorganic mask layer 130 may be formed on the carbon layer 120. The inorganic mask layer 130 may be formed of an inorganic material having an etch selectivity with respect to the carbon layer 120. The inorganic mask layer 130 may function as a hard mask in a subsequent process patterning the carbon layer 120. For example, the inorganic mask layer 130 may be formed of an oxynitride layer (e.g. a silicon oxynitride layer).

An antireflection layer 133 may be formed on the inorganic mask layer 130. The antireflection layer 133 may be formed of an organic material. In some embodiments, the antireflection layer may be omitted. In this case, the inorganic mask layer 130 may function as an antireflection layer.

An organic mask layer 135 may be formed on the antireflection layer 133. For example, the organic mask layer 135 may be formed of photoresist. The organic mask layer 135 may be patterned by a photolithography process to form mask-openings 137 exposing the inorganic mask layer 130. When the organic mask layer 135 is patterned, the antireflection layer 133 may also be patterned. Thus, each of the mask-openings 137 may successively penetrate the organic mask layer 135 and the antireflection layer 133, so that the mask-openings 137 may expose the inorganic mask layer 130. The mask-openings 137 may be formed in various shapes such as a hole-shape and/or a groove-shape. In some embodiments, the mask-openings 137 may have hole-shapes.

Figure 5:
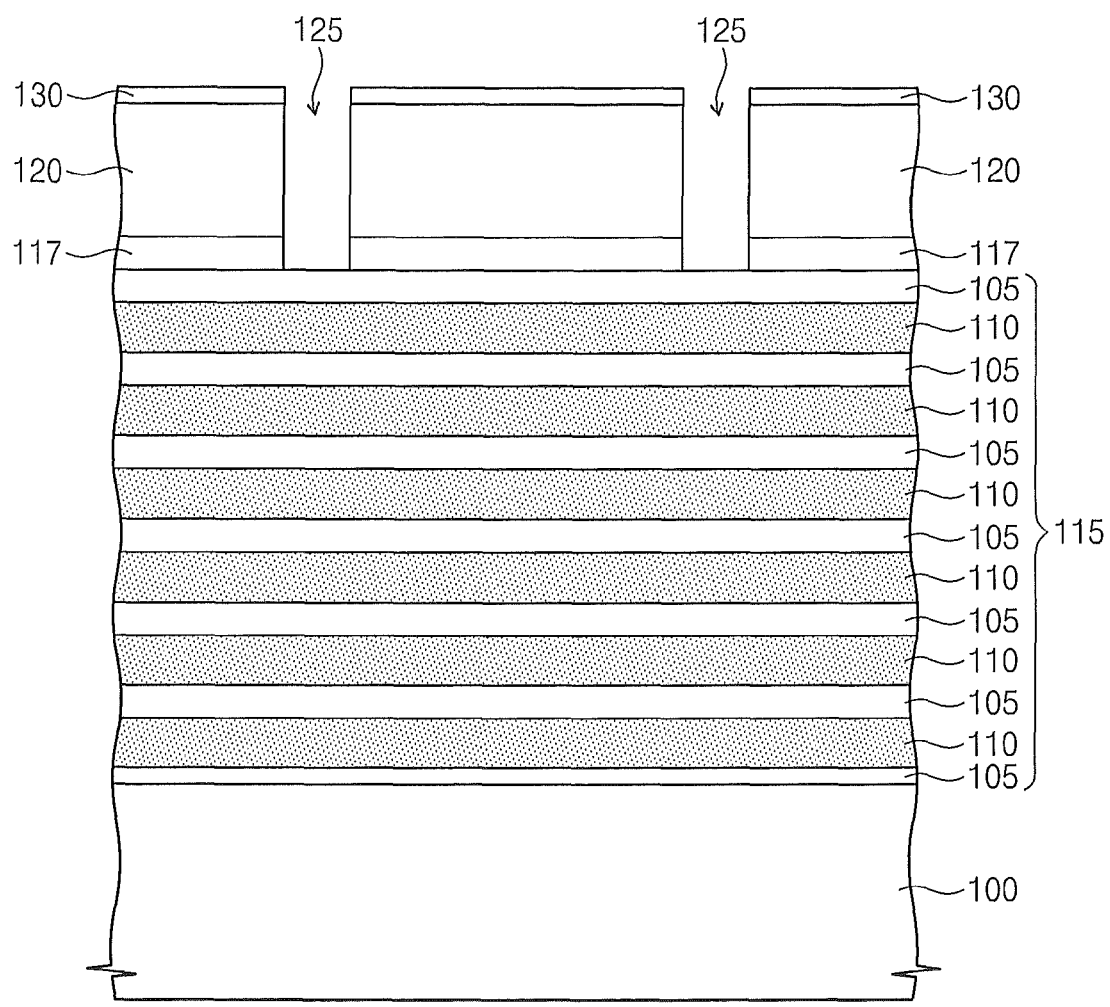

Referring to FIG. 5, the inorganic mask layer 130 exposed by the mask-openings 137 may be etched to expose the carbon layer 120. The exposed carbon layer 120 and the assistant mask layer 117 may be successively etched using the organic mask layer 135, the antireflection layer 133, and the inorganic mask layer 130 as etch masks, thereby forming openings 125 exposing the etch target layer 115. The exposed carbon layer 120 may be etched using an etching gas including $Cl_2$, $SiCl_4$, Ar, and/or $O_2$. The exposed carbon layer 120 may be etched in an inductive-coupled plasma type chamber or a capacitive-coupled plasma type chamber. The assistant mask layer 117 may be etched under etching condition(s) different from the etching condition(s) of the exposed carbon layer 120. The openings 125 may be self-aligned with the mask-openings 137, respectively.

Subsequently, a residual organic mask layer 135 and the antireflection layer 133 may be removed. The residual organic mask layer 135 and the antireflection layer 133 may be removed by an ashing process using oxygen plasma. At this time, at least a portion of the inorganic mask layer 130 may remain on the carbon layer 120 having the openings 125.

Figure 8:
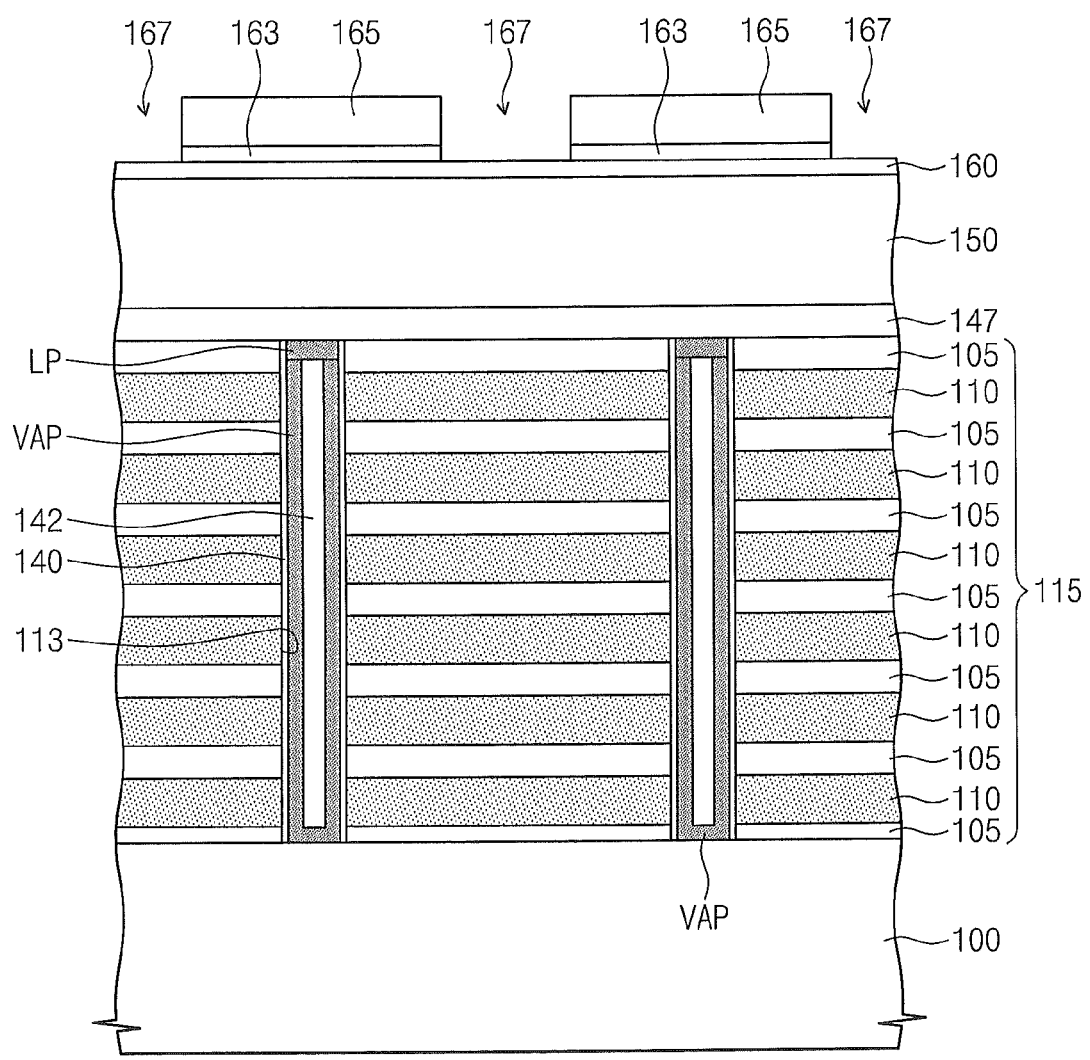

Referring to FIG. 8, the exposed etch target layer 115 is etched using the carbon layer 120 as an etch mask. Thus, holes 113 may be formed to penetrate the etch target layer 115. The holes 113 may expose the substrate 100. The holes 113 may be very deep. The remaining inorganic mask layer 130 may be removed when the etch target layer 115 is etched. An upper portion of the carbon layer 120 may be removed during the etching process for the formation of the holes 113. The removed upper portion of the carbon layer 120 includes the top end portion having the high boron concentration. Thus, immediately after the etch target layer 115 is etched to form the holes 113, a residual carbon layer 120e on the etch target layer 115 may have a relatively low boron concentration.

Figure 6:
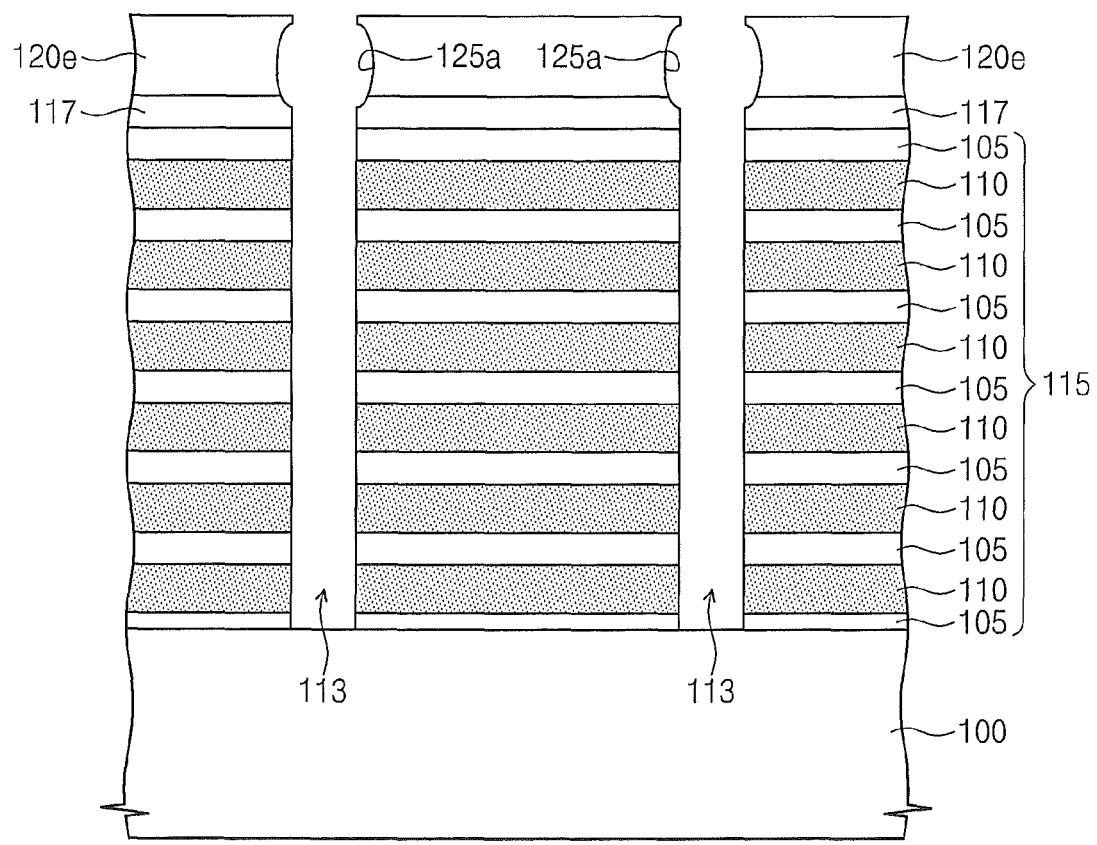

Because the holes 113 are deep, a bowing profile may be formed during the etching process for the formation of the holes 113 as illustrated in FIG. 6. At this time, the residual carbon layer 120e may have a sufficient thickness so that the bowing profile is substantially formed in an opening 125a penetrating the residual carbon layer 120e and the assistant mask layer 117. In some embodiments, a region having the maximum width of the bowing profile may be disposed in a portion of the opening 125a, which penetrates the residual carbon layer 120e. Thus, it is possible to reduce or minimize the influence of the bowing profile upon the holes 113.

As described above, the assistant mask layer 117 may have a greater hardness than the etch target layer 115. In other words, an etch rate of the assistant mask layer 117 may be lower than an etch rate of the etch target layer 115 during the etching process for the formation of the holes 113. Thus, it is possible to reduce or minimize a width-increase of a top end region of the hole 113. Because the hole 113 is deep, the width of a top end region of the hole 113 may be greater than a width of a bottom end region of the hole 113, so that a sidewall of the hole 113 may be inclined. Because the assistant mask layer 117 reduces or minimize the width-increase of the top end region of the hole 113, the sidewall of the hole 113 may be formed to be more vertical. If it is desired that the sidewall of the hole 113 is inclined, the assistant mask layer 117 may be omitted.

Figure 7:
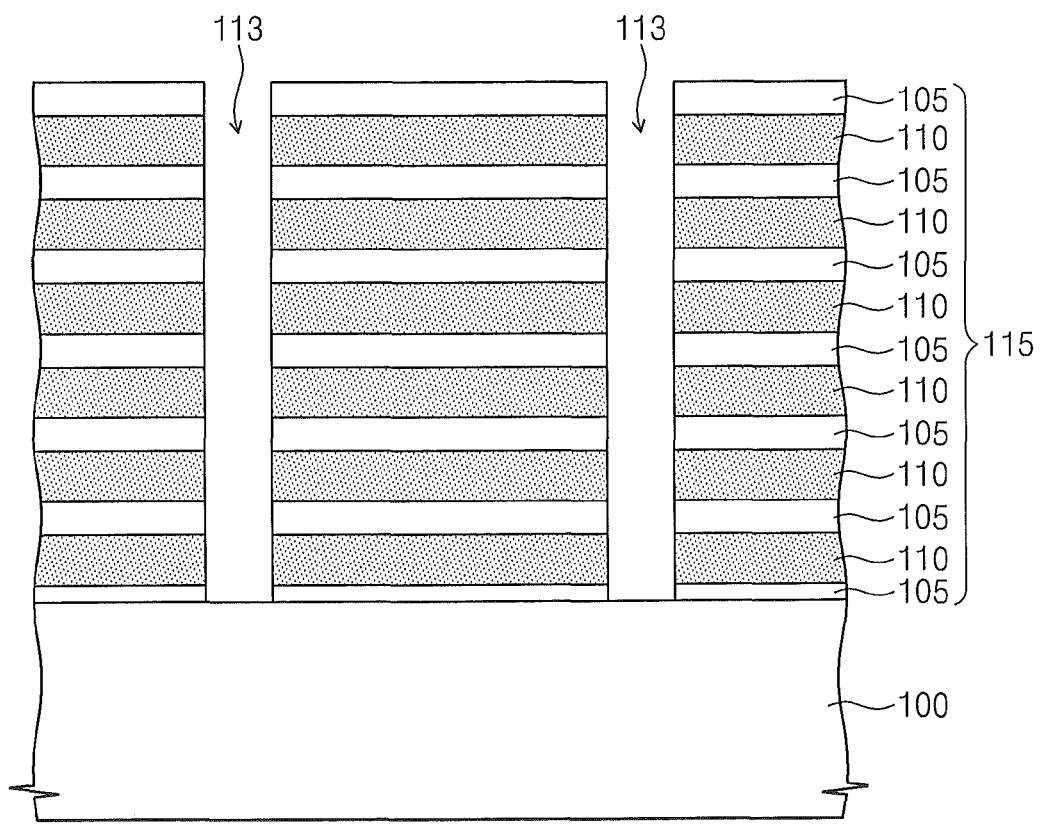

Referring to FIG. 7, subsequently, the residual carbon layer 120e may be removed. As described above, the residual carbon layer 120e has a low boron concentration. Thus, the residual carbon layer 120e may be easily removed. For example, the residual carbon layer 120e having a low boron concentration may be substantially removed by an ashing process using oxygen plasma. A carbon layer having a high boron concentration may not be easily removed by the ashing process. However, as described above, because the residual carbon layer 120e has the low boron concentration, the residual carbon layer 120e may be easily removed by the ashing process. For example, the boron concentration (or the maximum boron concentration) of the residual carbon layer 120e may be substantially equal to or less than about 6 atom %. After the holes 113 are formed, the assistant mask layer 117 may be removed.

According to the method of manufacturing the semiconductor device described above, the carbon layer 120 has boron concentrations different from each other according to positions in the carbon layer 120. Thus, it is possible to reduce or minimize the influence of the bowing profile upon the hole 113 and to easily remove the residual carbon layer 120e after the formation of the holes 113.

In more detail, the top end portion of the carbon layer 120 having the high boron concentration may have an excellent etch selectivity with respect to the etch target layer 115 and the bottom end portion of the carbon layer 120 having the low boron concentration may be easily removed by the ashing process after the formation of the holes 113. Accordingly, the carbon layer 120 may be formed to have a sufficient thickness. As a result, the bowing profile may be mainly formed in the residual carbon layer 120e, so that it is possible to reduce or minimize the influence of the bowing profile upon the holes 113.

Additionally, as described above, the top end portion of the carbon layer 120, which has a high boron concentration, may have a higher transmittance. Thus, even though the carbon layer 120 is thickly formed, the transmittance of the carbon layer 120 may be improved. As a result, the mask-openings 137 of the organic mask layer 135 may be easily aligned with underlying patterns.

If a carbon layer is uniformly doped in high boron concentration and is thickly formed, it may be difficult to remove a residual carbon layer after forming an etched region in a etch target layer. Alternatively, if a carbon layer uniformly doped in low boron concentration and is thickly formed, a residual carbon layer may become thin by a low etch selectivity after forming an etched region in a etch target layer. Thus, a bowing profile may influence the etched region. Additionally, a transmittance of the carbon layer may be lowered, so that a mask alignment process may be difficult. However, in embodiments of the inventive concept, because the carbon layer 120 has boron concentrations different from each other according to positions in the carbon layer 120, the above problems may be solved.

Referring to FIG. 8, a first sub-dielectric layer 140 may be conformally formed on the substrate 100 having the holes 113. The first sub-dielectric layer 140 on bottom surfaces of the holes 113 may be removed to expose the substrate 100. At this time, the first sub-dielectric layer 140 on a top surface of the etch target layer 115 may also be removed. Vertical active patterns VAP may be formed in the holes 113, respectively. The first sub-dielectric layer 140 may be disposed between each of the vertical active patterns VAP and an inner sidewall of each of the holes 113. The vertical active patterns VAP may be in contact with the substrate 100.

The vertical active pattern VAP may be formed of the same semiconductor material as the substrate 100. For example, the vertical active pattern VAP may be formed of silicon. The vertical active pattern VAP may be in an undoped state or be doped with dopants of the same conductivity type as the dopants of the substrate 100. The vertical active pattern VAP may have a pipe-shape or a macaroni shape. In this case, a filling dielectric pattern 142 may be formed to fill a space surrounded by the vertical active pattern VAP. For example, an active layer may be conformally formed on the substrate 100 having the holes 113 and then a filling dielectric layer may be formed on the active layer so as to fill the holes 113. The filling dielectric layer and the active layer may be planarized until the etch target layer 115 is exposed. Thus, the vertical active pattern VAP and the filling dielectric pattern 142 may be formed. The filling dielectric pattern 142 may be formed of oxide (e.g. silicon oxide).

The vertical active pattern VAP and the filling dielectric pattern 142 may be recessed to be lower than the top surface of the etch target layer 115. A semiconductor landing pad LP may be formed on each of the vertical active patterns VAP. The semiconductor landing pad LP may be in contact with the vertical active pattern VAP. A drain region may be formed in at least the semiconductor landing pad LP. The drain region may be doped with dopants of a second conductivity type. One of the first and second conductivity types is a P-type and the other of the first and second conductivity types is an N-type.

Subsequently, a second assistant mask layer 147 may be formed on the etch target layer 115 including the vertical active patterns VAP. The second assistant mask layer 147 may be formed of the same material as the assistant mask layer 117 of FIG. 1. A second carbon layer 150 may be formed on the second assistant mask layer 147. The second carbon layer 150 is in an amorphous state. The second carbon layer 150 is doped with boron. The second carbon layer 150 may have the same boron concentration profile as the carbon layer 120 illustrated in FIGS. 1 and 2. Alternatively, the second carbon layer 150 may have the same boron concentration profile as the carbon layer 120' illustrated in FIGS. 3 and 4.

A second inorganic mask layer 160 may be formed on the second carbon layer 150 and then a second antireflection layer 163 may be formed on the second inorganic mask layer 160. The second inorganic mask layer 160 and the second antireflection layer 163 may be formed of the same materials as the inorganic mask layer 130 and the antireflection layer 133 of FIG. 1, respectively.

A second organic mask layer 165 may be formed on the second antireflection layer 163. The second organic mask layer 165 may be formed of photoresist. The second organic mask layer 165 and the second antireflection layer 163 may be patterned by a second photolithography process, thereby forming second mask-openings 167. In some embodiments, the second mask-openings 167 may have groove-shapes extending in one direction parallel to the top surface of the substrate 100. The second mask-openings 167 may expose the second inorganic mask layer 160.

Figure 9:
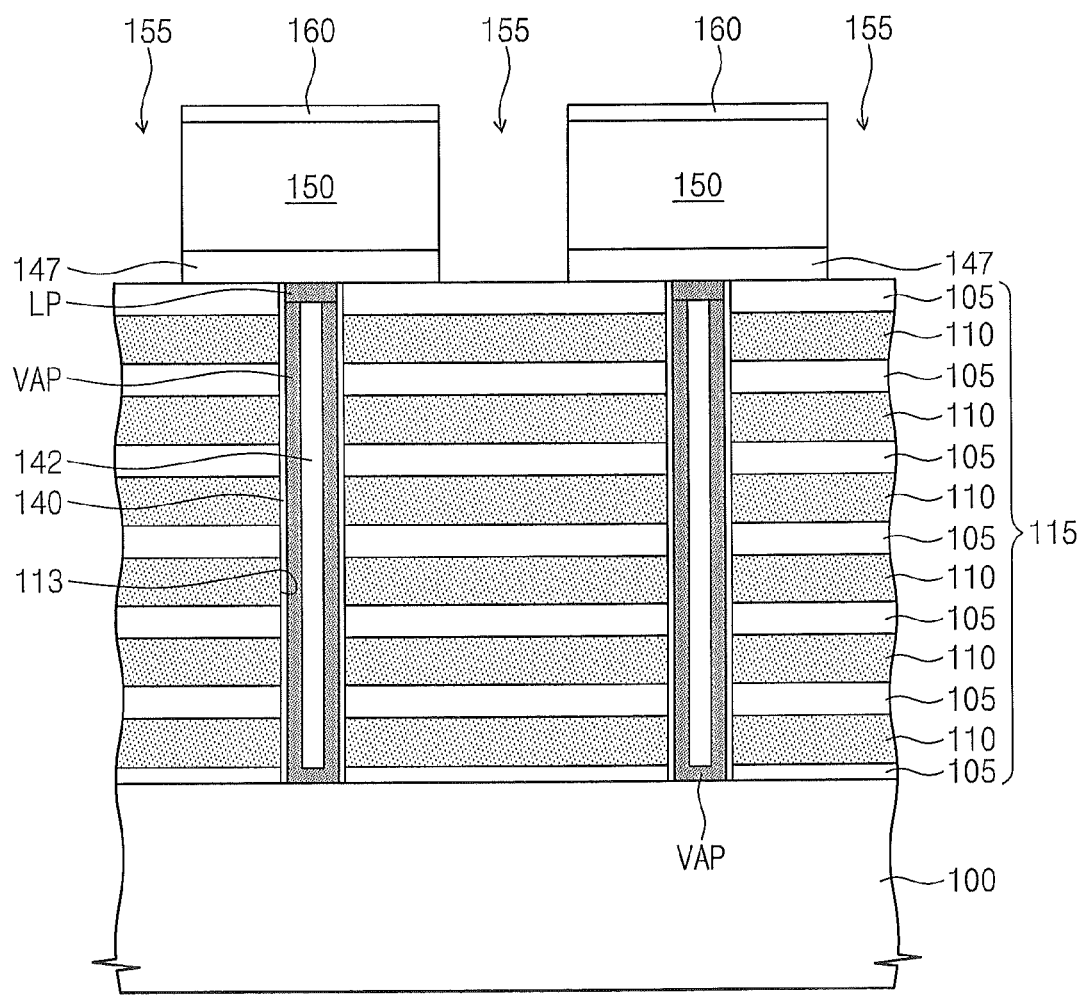

Referring to FIG. 9, the second inorganic mask layer 160 may be etched using the second organic mask layer 165 having the second mask-openings 167 as an etch mask so as to expose the second carbon layer 150. Subsequently, the exposed second carbon layer 150 and the second assistant mask layer 147 are successively etched using the second organic mask layer 165, the second antireflection layer 163, and the second inorganic mask layer 160 as an etch mask. Thus, second openings 155 penetrating the carbon layer 150 and the second assistant mask layer 147 may be formed. The second openings 155 expose the etch target layer 115. At this time, the vertical active patterns VAP are covered by the second carbon layer 150. Subsequently, a residual second organic mask layer 165 and the second antireflection layer 163 may be removed by an ashing process. At least a portion of the second inorganic mask layer 160 may remain on the second carbon layer 150.

Figure 10:
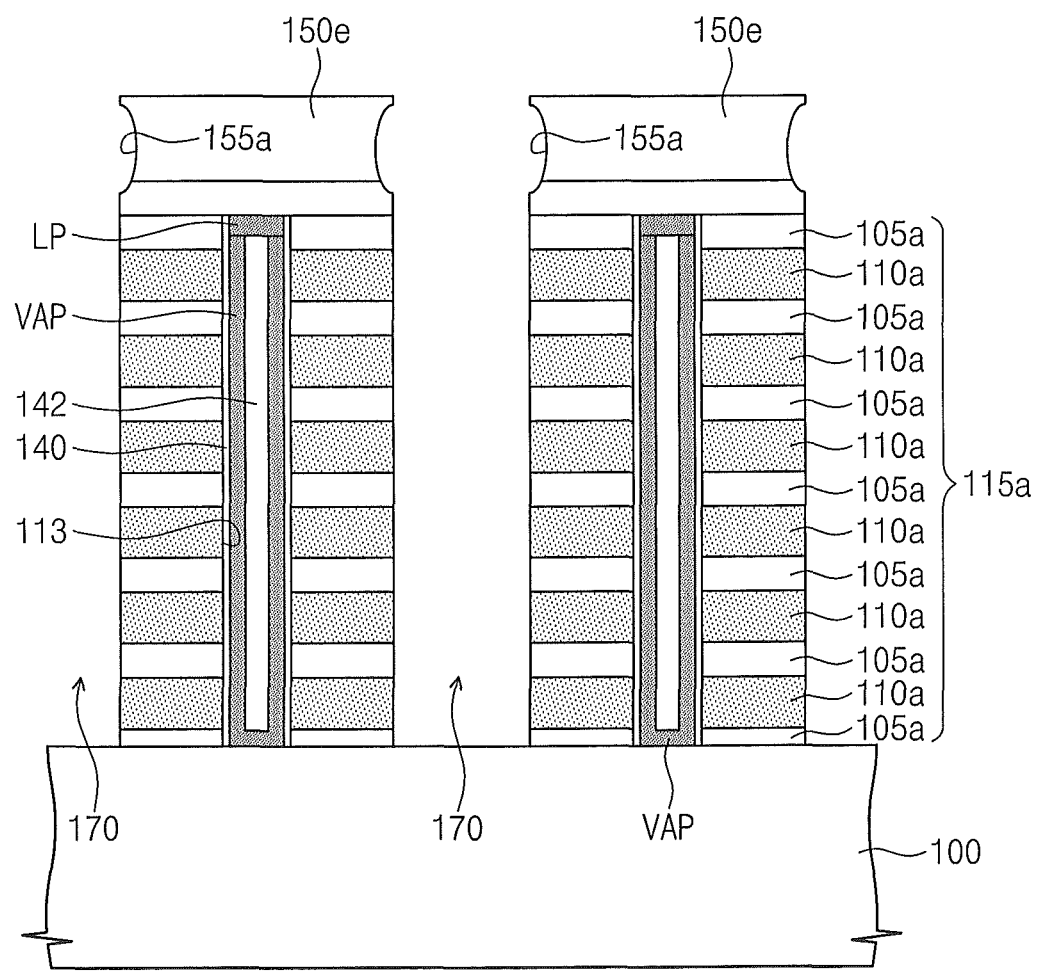

Referring to FIG. 10, the etch target layer may be etched using the second carbon layer 150 as an etch mask, thereby forming trenches 170. At this time, a mold pattern 115a may be formed between the trenches 170 adjacent to each other. The trenches 170 may have groove-shapes extending in one direction. The mold pattern 115a may include insulating patterns 105a and the sacrificial patterns 110a that are alternately and repeatedly stacked. The residual second inorganic mask layer 160 and an upper portion of the second carbon layer 150 may be removed during the etching process for the formation of the trenches 170. The removed upper portion of the carbon layer 150 includes a top end portion of the second carbon layer 150 that has a high boron concentration. After the trenches 170 are formed, a residual second carbon layer 150e has a low boron concentration.

As described with reference to FIG. 7, a bowing profile may be formed during the formation of the trenches 170 and the bowing profile may be substantially formed in a second opening 155a penetrating the residual carbon layer 150e and the second assistant mask layer 147.

Figure 11:
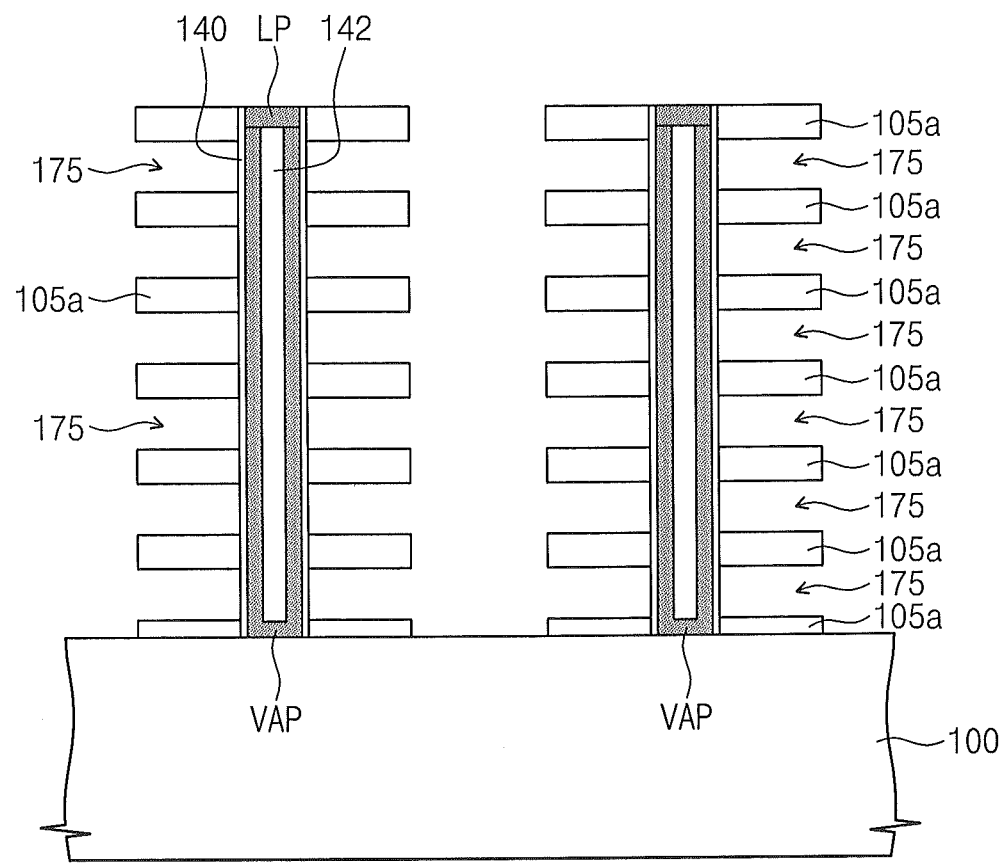

Referring to FIG. 11, the residual second carbon layer 150e may be removed. Because the residual second carbon layer 150e has a low boron concentration, the residual second carbon layer 150e may be easily removed by an ashing process, etc. Subsequently, the second assistant mask layer 147 may be removed.

The sacrificial patterns 110a exposed by the trenches 170 may be removed to form empty regions 175. The empty regions 175 may be formed between the insulating patterns 105a that are vertically spaced apart from each other. In other words the insulating patterns 105a and the empty regions 175 may be alternately and repeatedly stacked.

Figure 12:
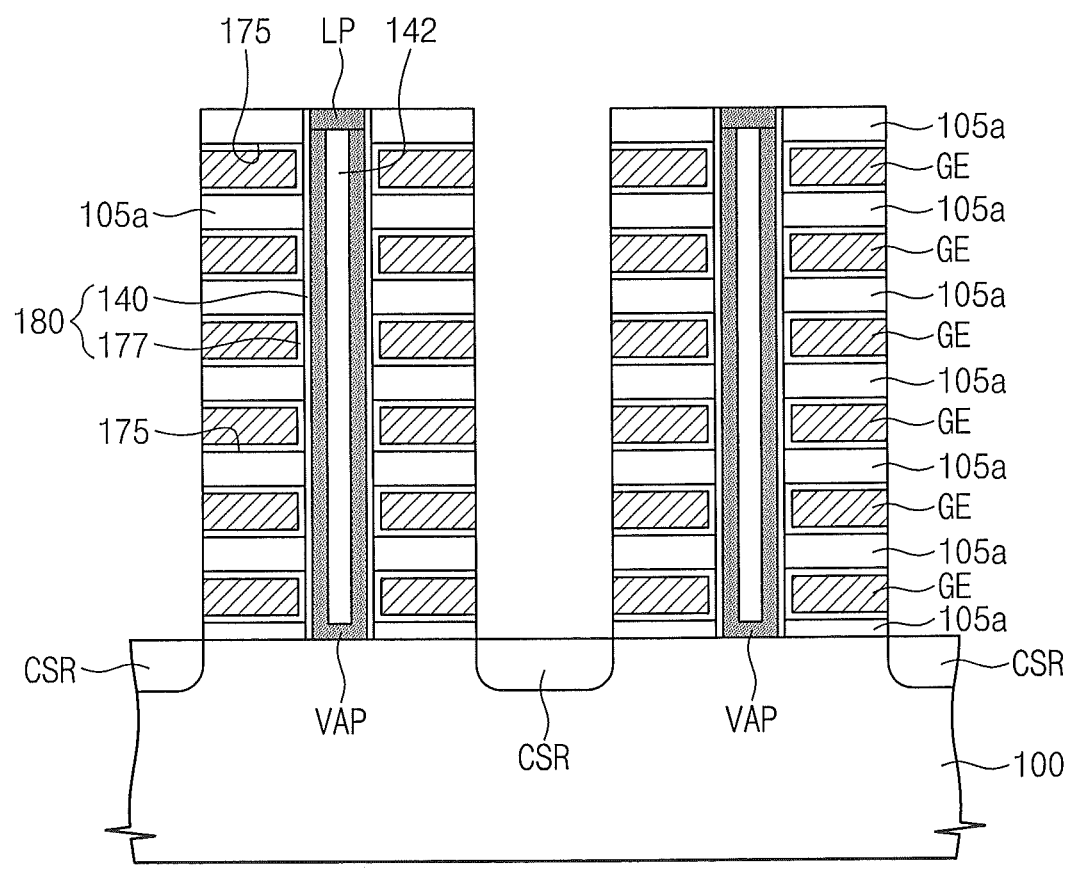

Referring to FIG. 12, a second sub-dielectric layer 177 may be conformally formed on the substrate 100 having the empty regions 175 and then a conductive layer may be formed to fill the empty regions 175. The conductive layer disposed outside the empty regions 175 may be removed to form gate electrodes GE respectively filling the empty regions 175. The gate electrodes GE may be formed of at least one of a doped semiconductor material (e.g. doped silicon), metal (e.g. tungsten, titanium, and/or tantalum), a conductive metal nitride (e.g. titanium nitride, tantalum nitride, and/or tungsten nitride), and a conductive metal-semiconductor compound (e.g. metal silicide).

A gate dielectric layer 180 may consist of the first and second sub-dielectric layers 140 and 177 between each of the gate electrodes GE and each of the vertical active patterns YAP. In some embodiments, the gate dielectric layer 180 may include a tunnel dielectric layer, a charge storing layer, and a blocking dielectric layer. The tunnel dielectric layer is adjacent to the vertical active pattern VAP, the blocking dielectric layer is adjacent to the gate electrode GE, and the charge storing layer is disposed between the tunnel dielectric layer and the blocking dielectric layer.

The tunnel dielectric layer may include at least one of oxide (e.g. silicon oxide), oxynitride (e.g. silicon oxynitride), and metal oxide (e.g. hafnium oxide). The charge storing layer may include a trap dielectric layer (e.g. a silicon nitride layer) that has traps storing charges. The blocking dielectric layer may include a high-k dielectric layer having a dielectric constant higher than that of the tunnel dielectric layer. For example, the high-k dielectric layer may include an insulating metal oxide layer, such as an aluminum oxide layer and/or a hafnium oxide layer. Additionally, the blocking dielectric layer may further include a barrier dielectric layer having an energy band gap greater than that of the high-k dielectric layer. For example, the barrier dielectric layer may be formed of a silicon oxide layer.

The first sub-dielectric layer 140 may include at least a portion of the tunnel dielectric layer and the second sub-dielectric layer 177 may include at least a portion of the blocking dielectric layer. Here, one of the first and second sub-dielectric layers 140 and 177 includes the charge storing layer. For example, the first sub-dielectric layer 140 may include the tunnel dielectric layer, the charge storing layer, and the barrier dielectric layer, and the second sub-dielectric layer 177 may include the high-k dielectric layer.

In other embodiments, the second sub-dielectric layer 177 may be formed on the inner sidewall of the hole 113 before the first sub-dielectric layer 140 is formed. In still other embodiments, the first sub-dielectric layer 140 may be formed on inner surfaces of the empty regions 175 before the second sub-dielectric layer 177 is formed. In this case, the vertical active pattern VAP may be in contact with the inner sidewall of the hole 113.

Dopants of the second conductivity type may be provided into the substrate 100 under the trenches 170, thereby forming common source regions CSR.

In the stacked gate electrodes GE, the lowermost gate electrode may correspond to a ground selection gate electrode and the uppermost gate electrode may correspond to a string selection gate electrode. The gate electrodes between the lowermost and the uppermost gate electrodes may correspond to cell gate electrodes. Vertical channel regions controlled by the gate electrode GE may be defined in the vertical active pattern VAP. Thus, a vertical cell string including the vertical active pattern VAP may be defined. As a result, the semiconductor device according to the present embodiment may be realized as a three-dimensional NAND non-volatile memory device.

Figure 13:
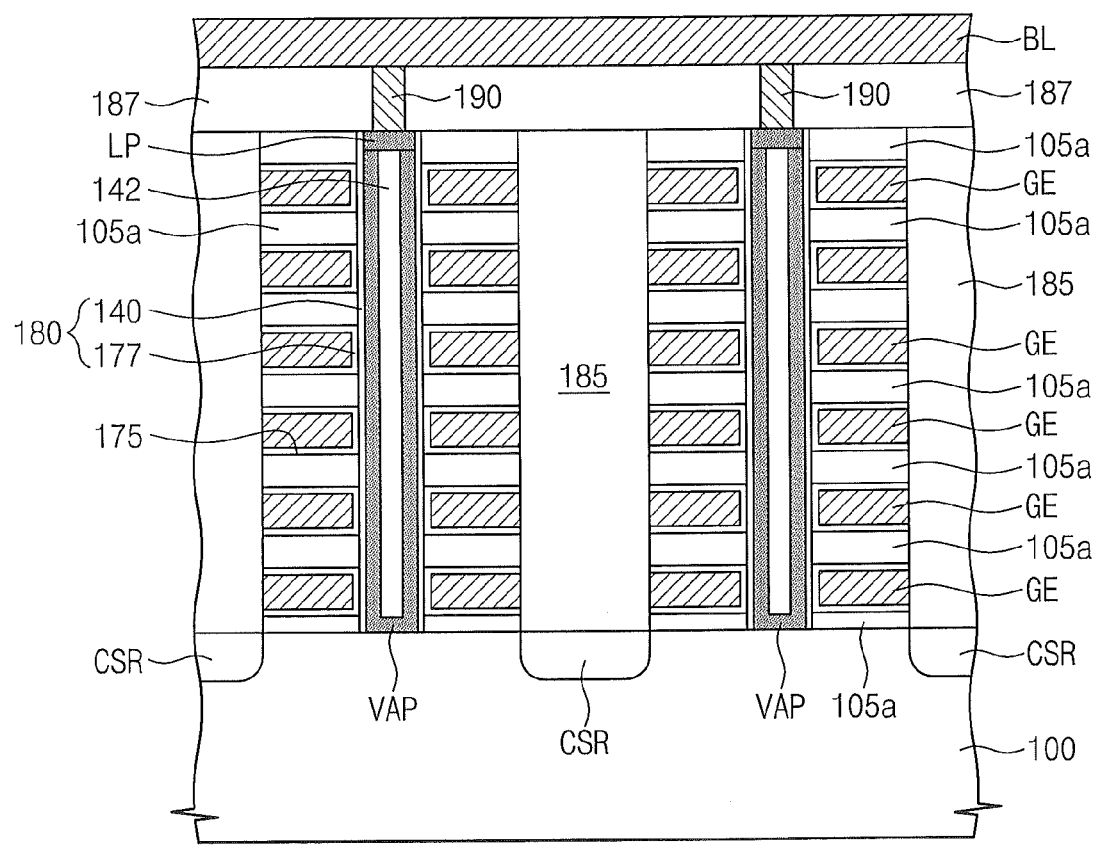

Referring to FIG. 13, device isolation patterns 185 may be formed to fill the trenches 170, respectively. Subsequently, an interlayer dielectric layer 187 may be formed on the substrate 100. Contact plugs 190 may be formed to penetrate the interlayer dielectric layer 187. The contact plugs 190 may be connected to the semiconductor landing pads LP, respectively. A bit line BL may be formed on the interlayer dielectric layer 187. The bit line BL may be connected to the contact plug 190.

FIGS. 14 to 18 are cross-sectional views illustrating a method of manufacturing a semiconductor device according to a second embodiment of the inventive concept. In the present embodiment, the carbon layer according to embodiments of the inventive concept may be applied to a method of manufacturing a semiconductor device including capacitors.

Figure 14:
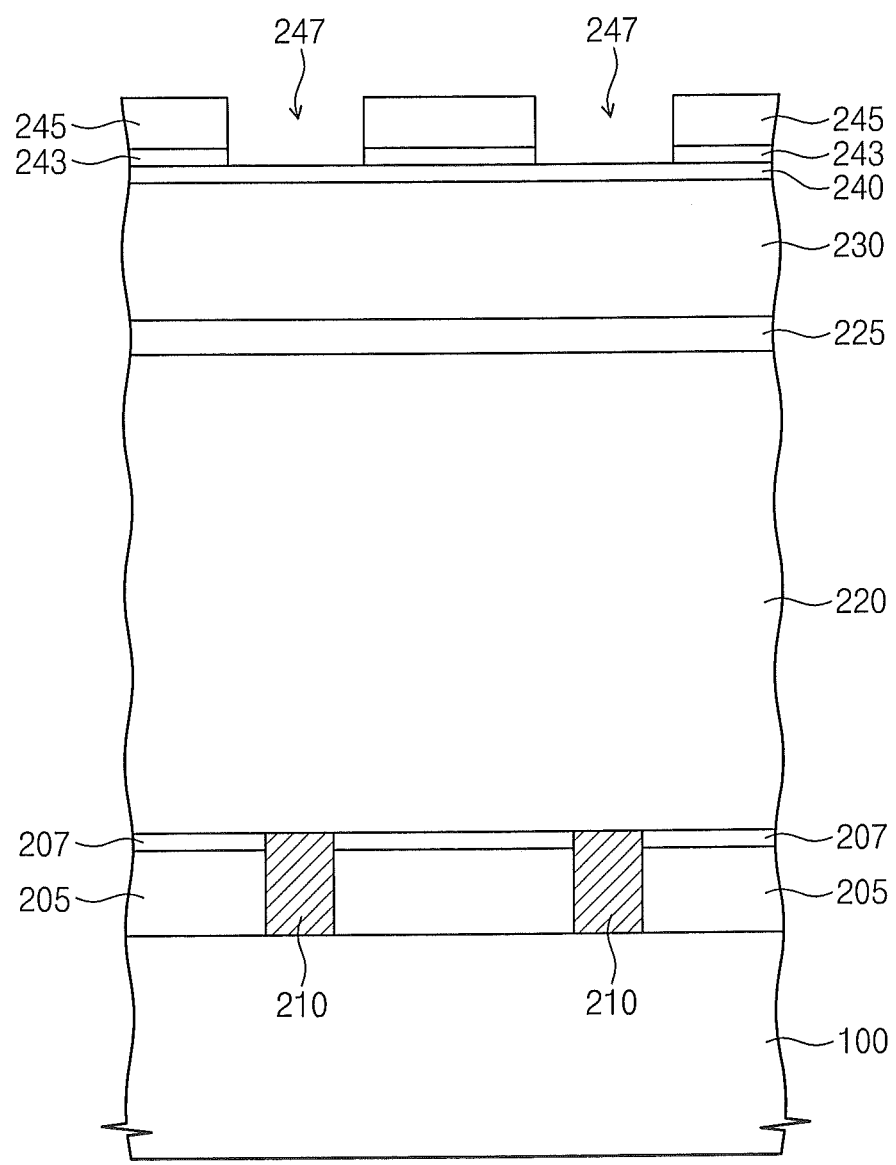
FIGS. 14 to 18 are cross-sectional view illustrating a method of manufacturing a semiconductor device according to a second embodiment of the inventive concept.

Referring to FIG. 14, an interlayer dielectric layer 205 and an etch stop layer 207 may be sequentially formed on a substrate 100. The interlayer dielectric layer 205 may be formed of a silicon oxide layer and the etch stop layer 207 may be formed of a silicon nitride layer. Lower contact plugs 210 may be formed to successively penetrate the interlayer dielectric layer 205 and the etch stop layer 207. The lower contact plugs 210 are formed of a conductive material. The lower contact plugs 210 may be electrically connected to terminals of switching elements (e.g. a diode or a transistor, not shown) formed under the interlayer dielectric layer 205, respectively.

Next, an etch target layer 220 may be formed on the etch stop layer 207 and the lower contact plugs 210. In the present embodiment, the etch target layer 220 may correspond to a mold. The etch target layer 220 may be formed of a silicon oxide layer.

An assistant mask layer 225 may be formed on the etch target layer 220. A carbon layer 230 may be formed on the assistant mask layer 225. The assistant mask layer 225 may have the same characteristics as the assistant mask layer 117 of FIG. 1. In other embodiments, the assistant mask layer 225 may be omitted. The carbon layer 230 is in an amorphous state. The carbon layer 230 is doped with boron. The carbon layer 230 may have the same boron concentration profile as the carbon layer 120 described with reference to FIGS. 1 and 2. Alternatively, the carbon layer 230 may have the same boron concentration profile as the carbon layer 120 described with reference to FIGS. 3 and 4.

An inorganic mask layer 240 may be formed on the carbon layer 230. The inorganic mask layer 240 may have the same characteristics as the inorganic mask layer 130 of FIG. 1. An antireflection layer 243 may be formed on the inorganic mask layer 240. The antireflection layer 243 may be formed of the same material as the antireflection layer 133 of FIG. 1. In other embodiments, the antireflection layer 243 may be omitted and the inorganic mask layer 240 may function as an antireflection layer.

An organic mask layer 245 may be formed on the antireflection layer 243. The organic mask layer 245 may be formed of photoresist. The organic mask layer 245 and the antireflection layer 243 may be patterned by a photolithography process, thereby forming mask-openings 247 exposing the inorganic mask layer 240.

Figure 15:
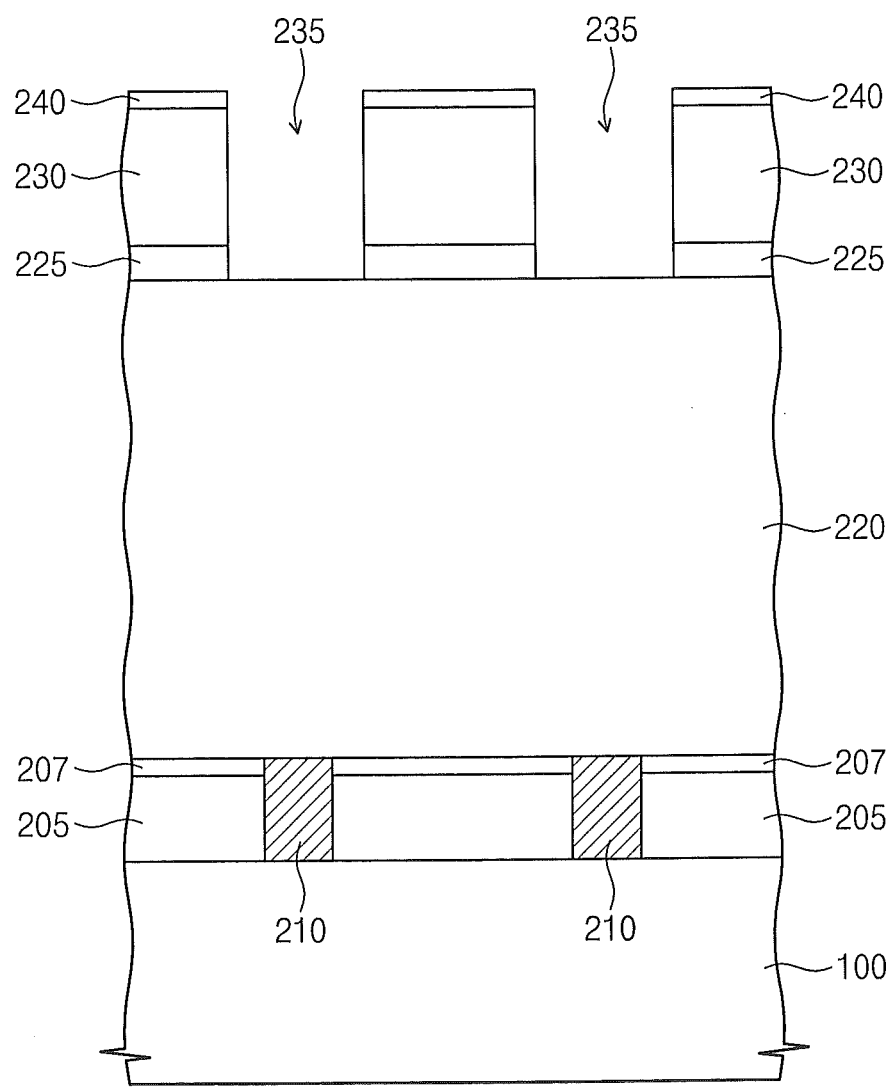

Referring to FIG. 15, the exposed inorganic mask layer 240 is etched to expose the carbon layer 230. The exposed carbon layer 230 and the assistant mask layer 225 may be successively etched using the organic mask layer 245, the antireflection layer 243, and the inorganic mask layer 240 as an etch mask, thereby forming openings 235 exposing the etch target layer 220. Subsequently, the organic mask layer 245 and the antireflection layer 243, which may remain on the inorganic mask layer 240, may be removed by an ashing process. At this time, the inorganic mask layer 240 may remain on the carbon layer 230 having the openings 235.

Figure 16:
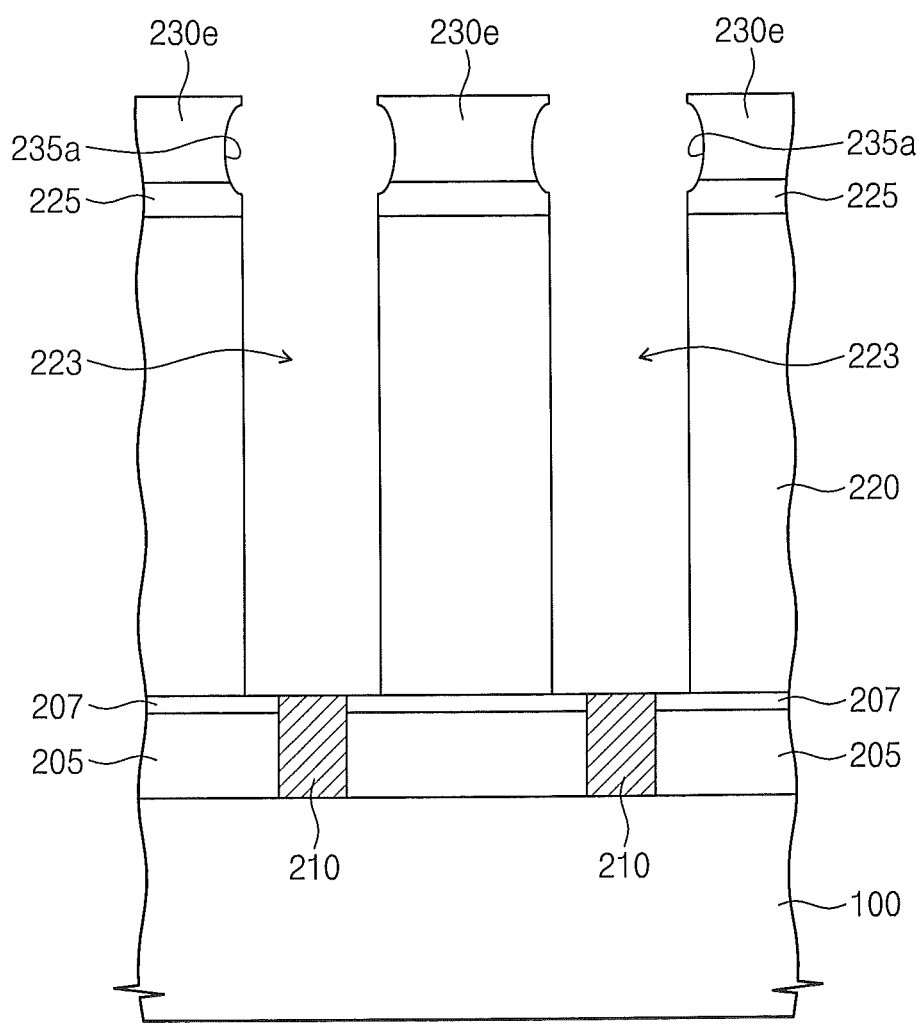

Referring to FIG. 16, the exposed etch target layer 220 may be etched using the carbon layer 230 as an etch mask, thereby forming capacitor-holes 223. The capacitor-holes 223 may expose the lower contact plugs 210, respectively. The remaining inorganic mask layer 240 and an upper portion of the carbon layer 230 may be removed during the formation of the capacitor-holes 223. In other words, the upper portion having a high boron concentration of the carbon layer 230 may be removed, and a residual carbon layer 230e may have a low boron concentration after forming the capacitor-holes 223.

A bowing profile may be formed during the formation of the capacitor-holes 223. As described with reference to FIG. 6, the bowing profile may be substantially formed in an opening 235a penetrating the residual carbon layer 230e and the assistant mask layer 225. In other words, a region having the maximum width of the bowing profile may be disposed in a portion of the opening 235a, which penetrates the residual carbon layer 230e.

Figure 17:
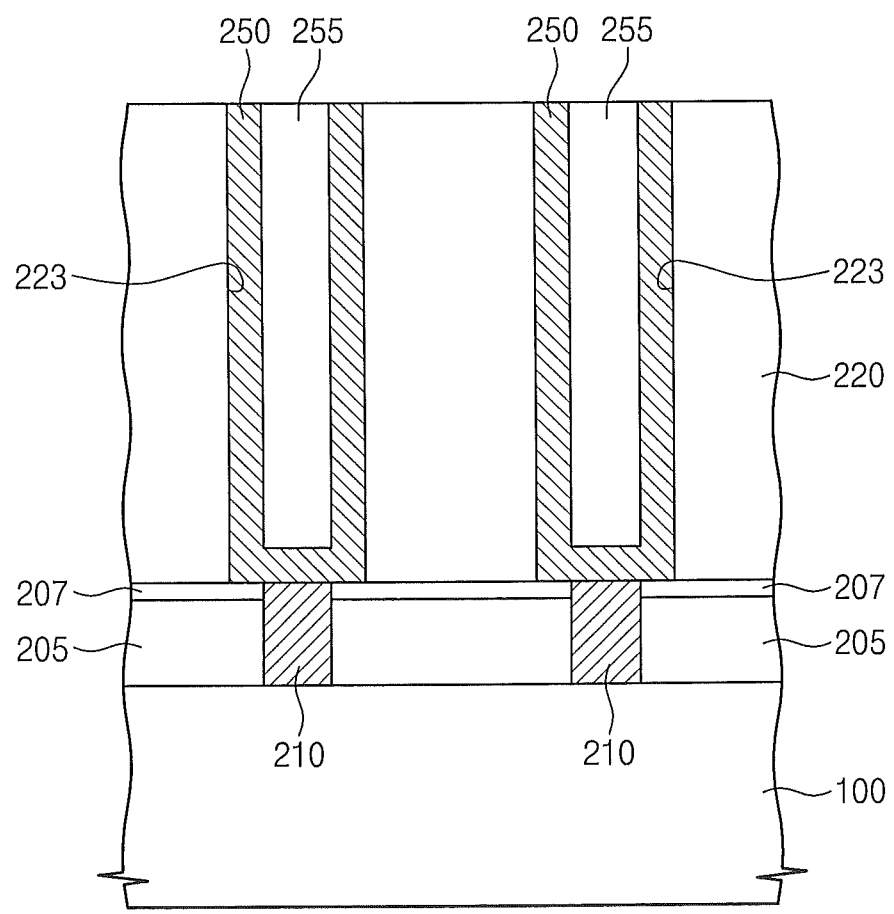

Referring to FIG. 17, the residual carbon layer 230e may be removed. Because the residual carbon layer 230e has the low boron concentration, the residual carbon layer 230e may be easily removed by an ashing process, etc. Subsequently, the assistant mask layer 225 may be removed.

Next, a conductive layer may be conformally formed on the substrate 100 having the capacitor-holes 223. A sacrificial filling layer may be formed on the conductive layer so as to fill the capacitor-holes 223. The sacrificial filling layer and the conductive layer may be planarized until the etch target layer 220 is exposed, thereby forming a lower electrode 250 and a sacrificial filling pattern 255 in each of the capacitor-holes 223. The lower electrode 250 may include at least one of a doped semiconductor material (e.g. doped silicon), a conductive metal nitride (e.g. titanium nitride, tantalum nitride, and/or tungsten nitride), metal (e.g. ruthenium (Ru), iridium (Ir), titanium (Ti), and/or tantalum (Ta)), and a conductive metal oxide (e.g. iridium oxide). The sacrificial filling pattern 255 may be formed of silicon oxide.

Figure 18:
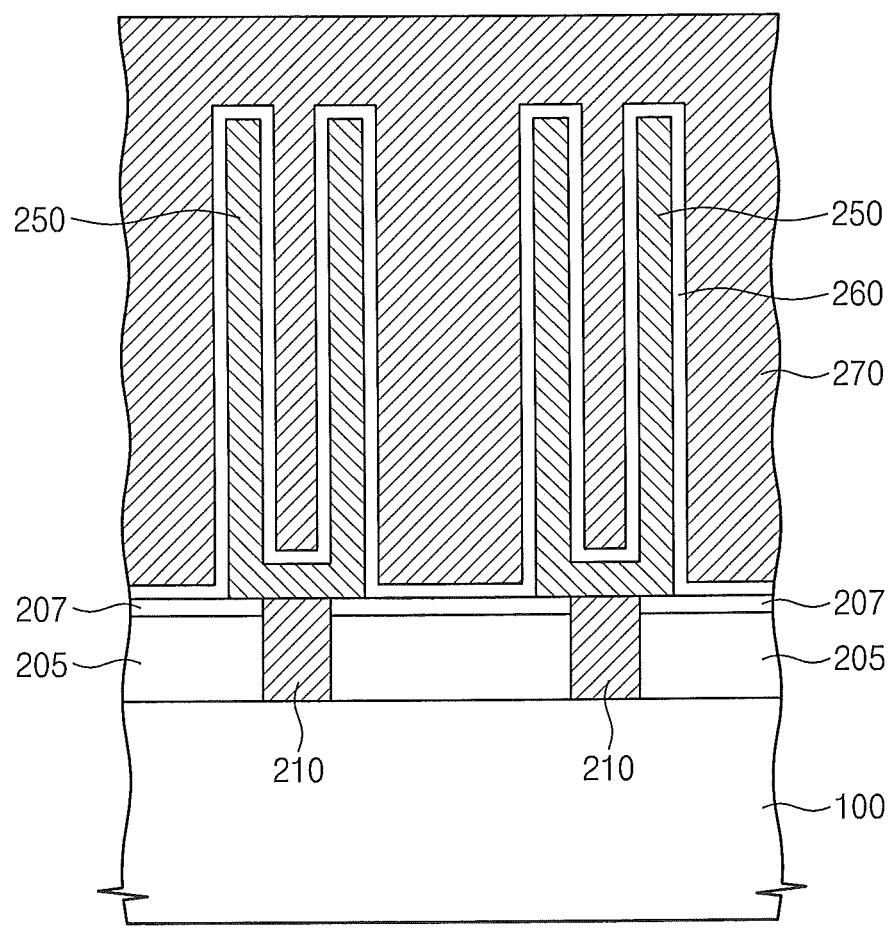

Referring to FIG. 18, the sacrificial filling pattern 255 and the etch target layer 220 may be removed to expose surfaces of the lower electrodes 250. At this time, the etch stop layer 207 may protect the interlayer dielectric layer 205.

A capacitor-dielectric layer 260 may be conformally formed on the surfaces of the lower electrodes 250. For example, the capacitor-dielectric layer 260 may include at least one of a silicon oxide layer, a silicon oxynitride layer, a silicon nitride layer, and a high-k dielectric layer (e.g. a metal oxide layer such as an aluminum oxide layer, a hafnium oxide layer).

An upper electrode 270 may be formed on the capacitor-dielectric layer 260. The upper electrode 270 may cover the surfaces of the lower electrodes 250. The upper electrode 270 may include at least one of a doped semiconductor material (e.g. doped silicon), a conductive metal nitride (e.g. titanium nitride, tantalum nitride, and/or tungsten nitride), metal (e.g. ruthenium (Ru), iridium (Ir), titanium (Ti), and/or tantalum (Ta)), and a conductive metal oxide (e.g. iridium oxide).

As described above, the carbon layer 230 according to the present embodiment may have the same boron concentration profile as the carbon layer 120 of FIGS. 1 and 2 or the carbon layer 120' of FIGS. 3 and 4. Thus, the method according to the present embodiment may obtain substantially the same effects as the first embodiment described above.

FIGS. 19 to 22 are cross-sectional views illustrating a method of manufacturing a semiconductor device according to a third embodiment of the inventive concept. In the present embodiment, the carbon layer according to embodiments of the inventive concept may be applied to a method of manufacturing a flash memory device including a floating gate.

Figure 19:
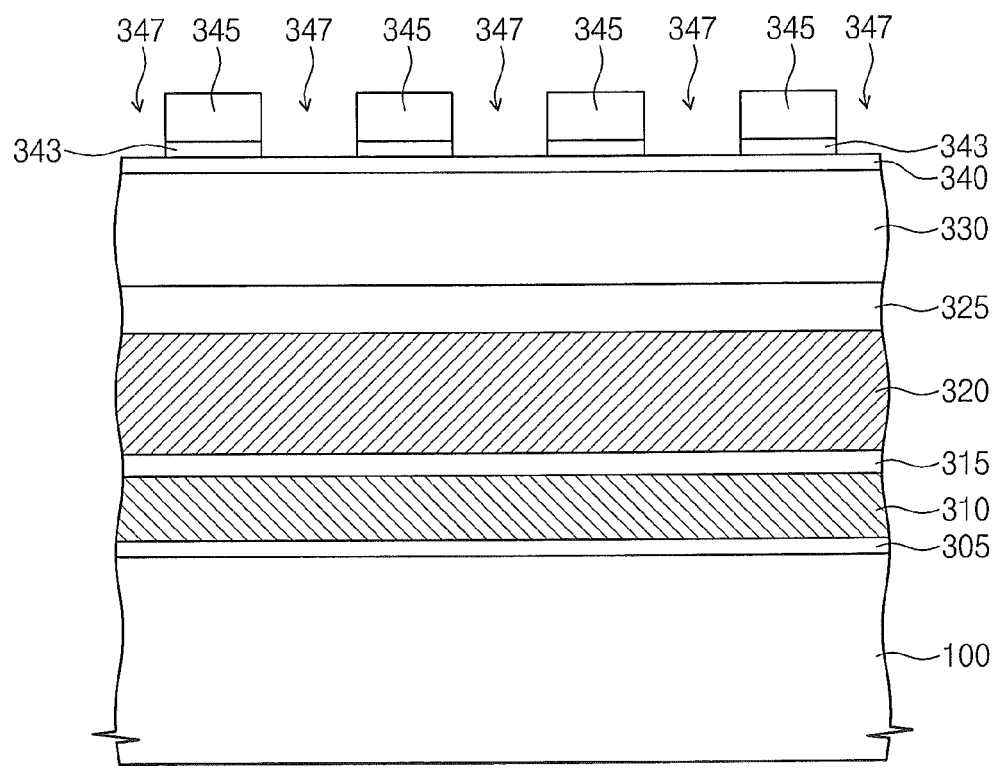
FIGS. 19 to 22 are cross-sectional view illustrating a method of manufacturing a semiconductor device according to a third embodiment of the inventive concept.

Referring to FIG. 19, a device isolation pattern (not shown) may be formed on the substrate 100 to define an active region. A tunnel dielectric layer 305 may be formed on the active region. The tunnel dielectric layer 305 may include at least one of a silicon oxide layer and a silicon oxynitride layer. A preliminary floating gate 310 may be formed on the tunnel dielectric layer 305. The preliminary floating gate 310 may be formed over the active region. The preliminary floating gate 310 may be formed of silicon. The preliminary floating gate 310 may be in an undoped state or be doped with dopants.

A blocking dielectric layer 315 may be conformally formed on the substrate 100 having the preliminary floating gate 310. The blocking dielectric layer 315 may include an oxide-nitride-oxide (ONO) layer and/or a high-k dielectric layer (e.g. an insulating metal oxide layer such as hafnium oxide layer and/or an aluminum oxide layer).

A control gate conductive layer 320 and a capping dielectric layer 325 may be sequentially formed on the blocking dielectric layer 315. The control gate conductive layer 320 may include at least one of a doped semiconductor material (e.g. doped silicon), a conductive metal nitride (e.g. titanium nitride, tantalum nitride, and/or tungsten nitride), metal (e.g. tungsten, titanium, and/or tantalum), and a conductive metal-semiconductor compound (e.g. metal silicide). The capping dielectric layer 325 may be formed of at least one of a silicon oxide layer, a silicon nitride layer, and a silicon oxynitride layer.

An etch target layer may include the tunnel dielectric layer 305, the preliminary floating gate 310, the blocking dielectric layer 315, the control gate conductive layer 320, and the capping dielectric layer 325. A carbon layer 330 may be formed on the etch target layer. The carbon layer 330 is in an amorphous state. The carbon layer 330 is doped with boron. The carbon layer 330 may have the same boron concentration profile as the carbon layer 120 described with reference to FIGS. 1 and 2. Alternatively, the carbon layer 330 may have the same boron concentration profile as the carbon layer 120' described with reference to FIGS. 3 and 4.

In other embodiments, before the carbon layer 330 is formed, an assistant mask layer having the same characteristics as the assistant mask layer 117 of FIG. 1 may further be formed on the etch target layer.

An inorganic mask layer 340, an antireflection layer 343, and an organic mask layer 345 may be sequentially formed on the carbon layer 330. The inorganic mask layer 340 may have the same characteristics as the inorganic mask layer of FIG. 1. The antireflection layer 343 may be formed of an organic material. In other embodiments, the antireflection layer 343 may be omitted and the inorganic mask layer 340 may function as an antireflection layer. The organic mask layer 345 may be formed of photoresist.

The organic mask layer 345 and the antireflection layer 343 may be patterned by a photolithography process to form mask-openings 347 exposing the inorganic mask layer 340. The mask-openings 347 may have groove-shapes extending in parallel to each other along one direction. Thus, a portion of the organic mask layer 345, which is disposed between the mask-openings 347 adjacent to each other, may have a linear shape extending in the one direction.

Figure 20:
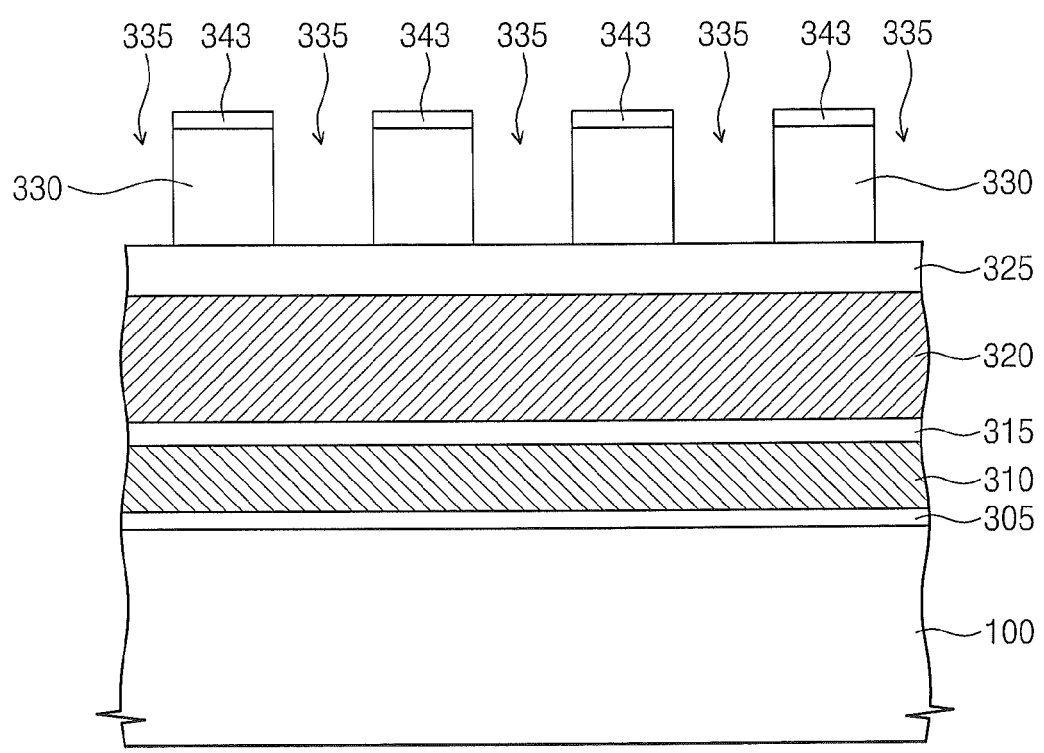

Referring to FIG. 20, the exposed inorganic mask layer 340 may be etched to expose the carbon layer 330. The exposed carbon layer 330 may be etched to form openings 335 exposing the capping dielectric layer 325. Due to the mask-openings 347, the openings 335 may have groove-shapes extending in the one direction. Thus, a portion of the carbon layer 330, which is disposed between the openings 335 adjacent to each other, may have a linear shape extending in the one direction. The portion of the carbon layer 330 defines a gate pattern. After the openings 335 are formed, the inorganic mask layer 340 may remain on the portion of the carbon layer 330.

Figure 21:
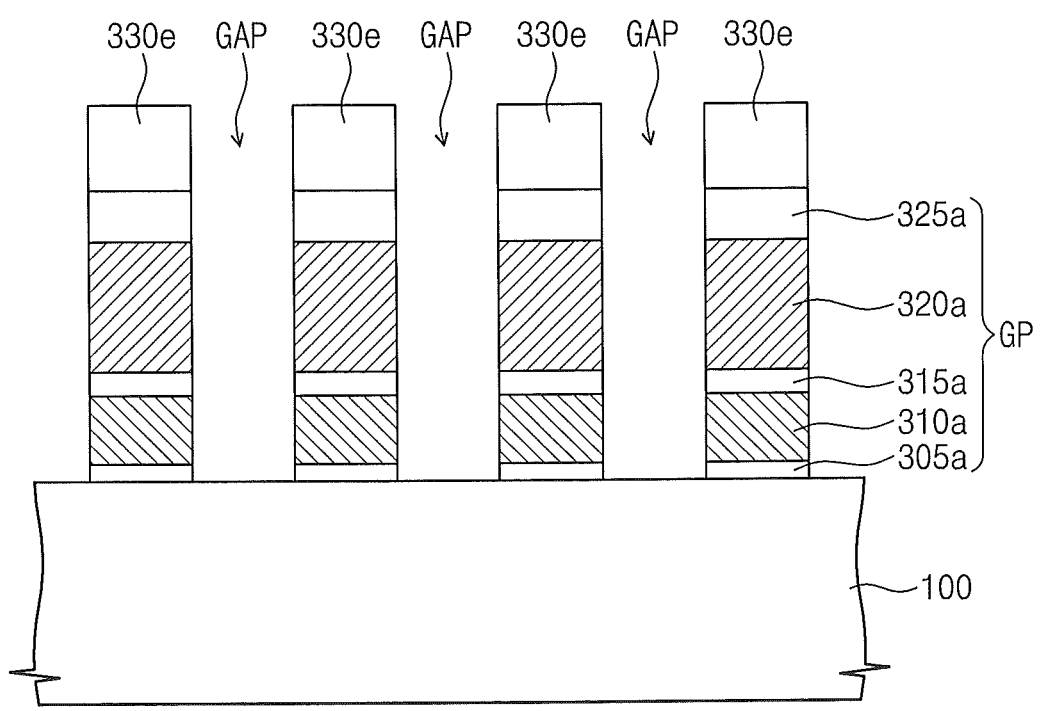

Referring to FIG. 21, the exposed capping dielectric layer 325, the control gate conductive layer 320, the blocking dielectric layer 315, the preliminary floating gate 310, and the tunnel dielectric layer 305 may be successively etched using the carbon layer 330 having the openings 330 as an etch mask. Thus, gate patterns GP may be formed. Each of the gate patterns GP may include a tunnel dielectric pattern 305a, a floating gate 310a, a blocking dielectric pattern 315a, a control gate electrode 320a, and a capping dielectric pattern 325a that are sequentially stacked. A gap region GAP may be defined between a pair of the gate patterns GP adjacent to each other. The gap region GAP corresponds to an etched region of the etch target layer.

During the formation of the gate patterns GP, an upper portion of the carbon layer 330 having a high boron concentration may be removed and a residual carbon layer 330e may have a low boron concentration.

Figure 22:
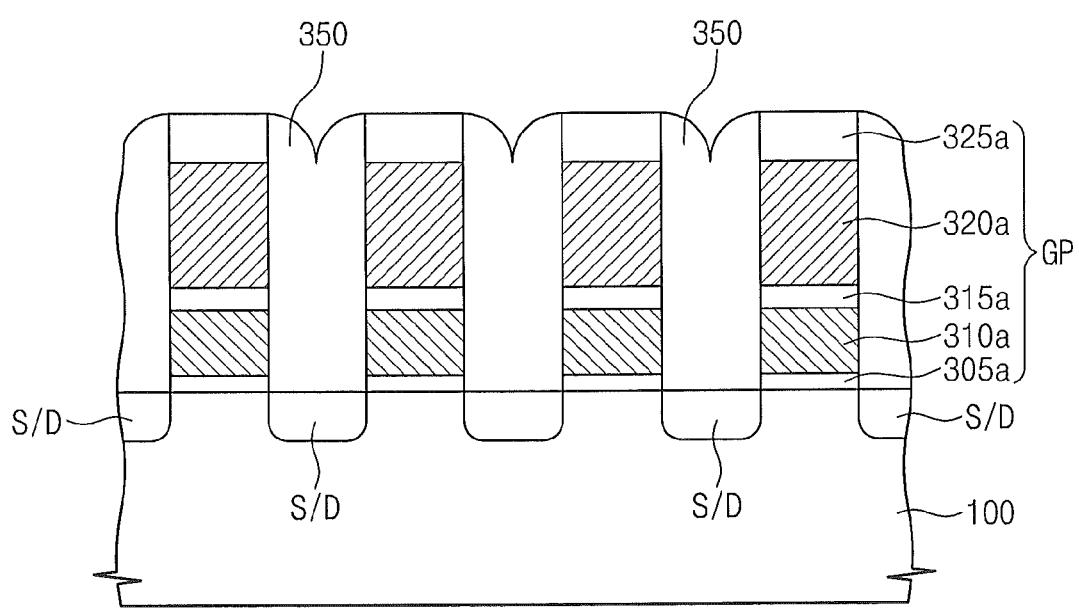

Referring to FIG. 22, the residual carbon layer 330e is removed. The residual carbon layer 330e may be easily removed by an ashing process, etc. Source/drain regions S/D may be formed in the active regions at both sides of each of the gate patterns GP. Gate spacers 350 may be formed on both sidewalls of each of the gate patterns GP.

As described above, because the carbon layer 330 has the same boron concentration as the carbon layer 120 of FIGS. 1 and 2 or the carbon layer 120' of the FIGS. 3 and 4, the manufacturing method according to the present embodiment may obtain substantially the same effects as the first embodiments described above.

The semiconductor devices formed by the embodiments described above may be encapsulated using various packaging techniques. For example, the semiconductor devices formed by the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor device formed by the above embodiments is mounted may further include at least one semiconductor device (e.g., a controller and/or a logic device) that controls the semiconductor device.

Figure 23:
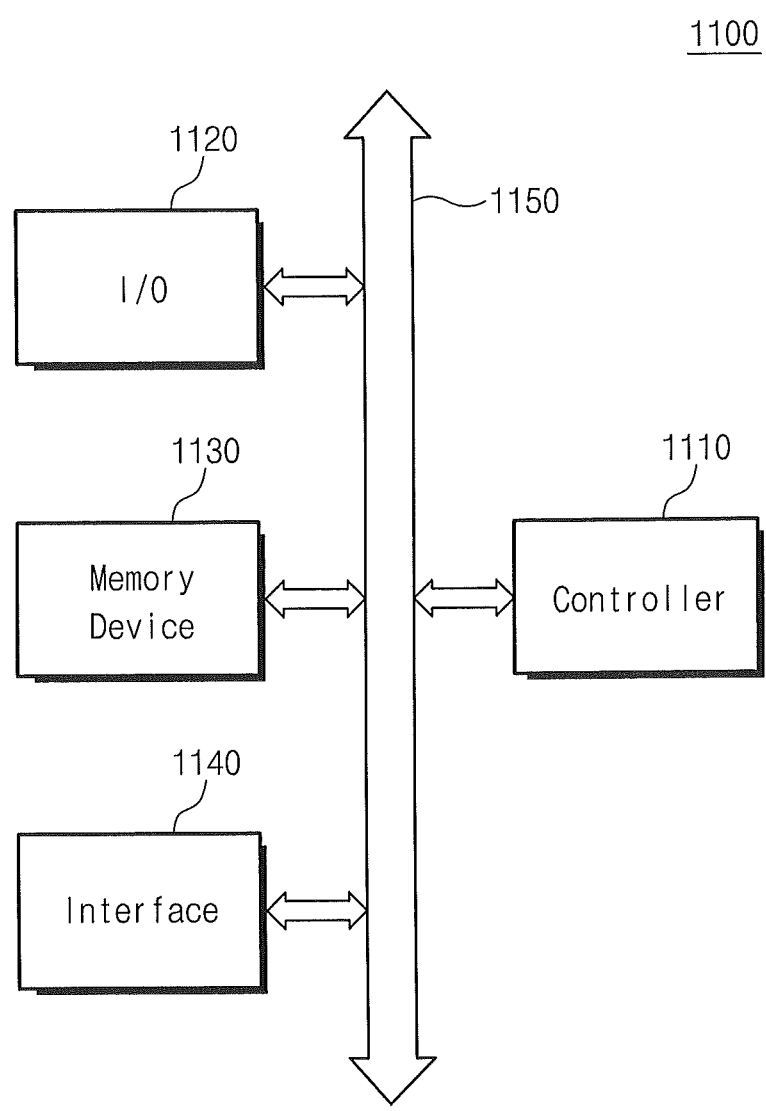
FIG. 23 is a schematic block diagram illustrating an example of electronic systems including the semiconductor devices formed by the methods according to embodiments of the inventive concept.

FIG. 23 is a schematic block diagram illustrating an example of electronic systems including the semiconductor devices formed by the methods according to embodiments of the inventive concept.

Referring to FIG. 23, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices formed by the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device, which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless communication.

Figure 24:
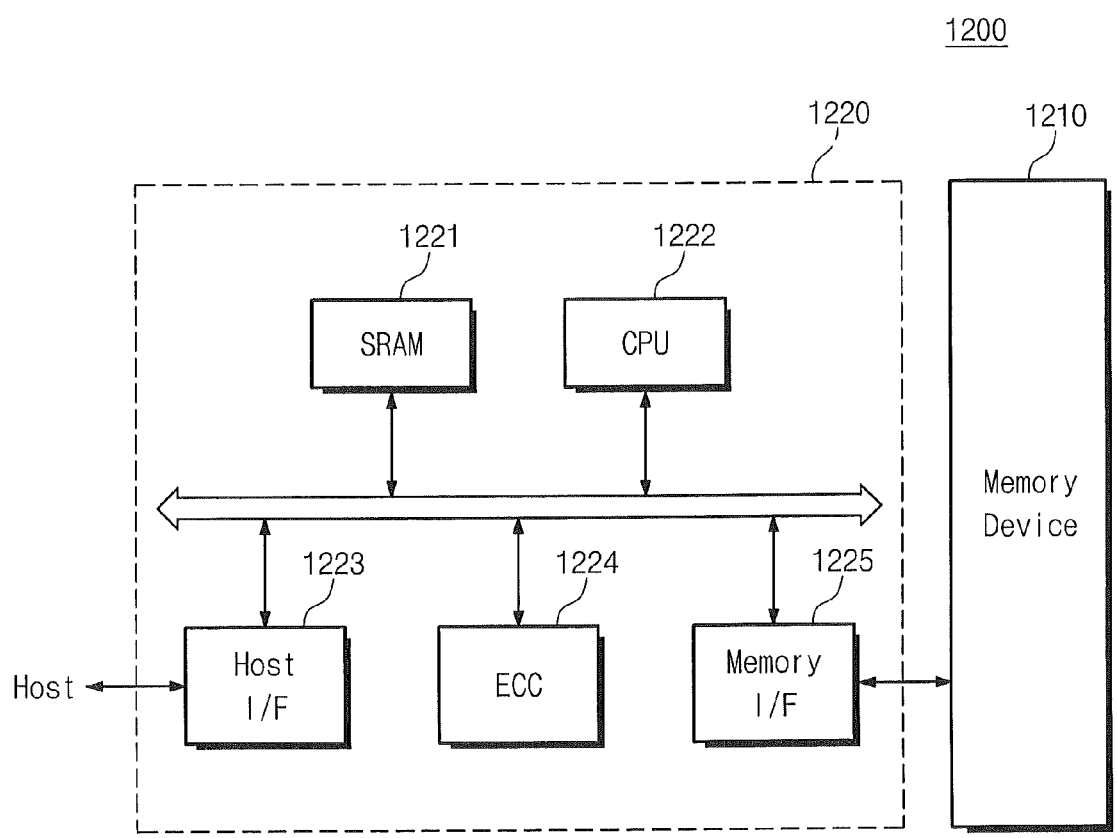
FIG. 24 is a schematic block diagram illustrating an example of memory cards including the semiconductor devices formed by the methods according to embodiments of the inventive concept.

FIG. 24 is a schematic block diagram illustrating an example of memory cards including the semiconductor devices formed by the methods according to embodiments of the inventive concept.

Referring to FIG. 24, a memory card 1200 according to an embodiment of the inventive concept may include a memory device 1210. The memory device 1210 may include at least one of the semiconductor devices formed by the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and a host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD), which are used as hard disks of computer systems.

According to the methods of manufacturing a semiconductor device described above, the carbon layer has different boron concentrations from each other according to positions in the carbon layer. Thus, it is possible to reduce or minimize the influence of the bowing profile with respect to the etched region in the etch target layer. Additionally, the residual carbon layer may be easily removed after etching the etch target layer. Moreover, even though the carbon layer is thick, the transmittance of the portion of the carbon layer may be increased, so that the alignment process of the mask-opening may be easily performed. As a result, the semiconductor device with high integration may be manufactured.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a semiconductor device, comprising:
    forming an etch target layer on a substrate, the etch target layer including first layers and second layers that are alternately and repeatedly stacked;
    forming a carbon layer doped with boron on the etch target layer, the carbon layer including a bottom end portion adjacent to the etch target layer and a top end portion on the bottom end portion;

forming a mask stack on the carbon layer, the mask stack including an inorganic mask layer, an organic mask layer, and an antireflection layer;
patterning the organic mask layer by a photolithography process to form a mask opening exposing the inorganic mask layer;
etching the exposed inorganic mask layer using the organic mask layer as an etch mask to expose the carbon layer; and
etching the exposed carbon layer to form an opening; exposing the etch target layer; and
etching the exposed etch target layer using the carbon layer as an etch mask to form a hole exposing the substrate;
wherein a boron concentration in the top end portion is different from that of the bottom end portion,
wherein the etch target layer is thicker than the carbon layer and the carbon layer is thicker than the mask stack.

2. The method of claim 1, wherein the carbon layer is in an amorphous state.

3. The method of claim 1, wherein the boron concentration of the top end portion of the carbon layer is greater than the boron concentration of the bottom end portion of the carbon layer.

4. The method of claim 1, wherein the boron concentration of the carbon layer gradually increases from a bottom surface of the carbon layer toward a top surface of the carbon layer.

5. The method of claim 1, wherein at least the top end portion of the carbon layer is removed for etching the etch target layer.

6. The method of claim 5, further comprising:
after etching the etch target layer, removing a residual portion of the carbon layer by an ashing process.

7. The method of claim 1, wherein the top end portion of the carbon layer has a greater transmittance than the bottom end portion of the carbon layer.

8. The method of claim 1, wherein a bowing profile is formed after etching the etch target layer; and
wherein a region having a maximum width of the bowing profile is formed in the opening penetrating the carbon layer.

9. The method of claim 1, further comprising:
before forming the carbon layer, forming an assistant mask layer on the etch target layer,
wherein patterning the carbon layer comprises successively patterning the carbon layer and the assistant mask layer to form an opening exposing the etch target layer; and
wherein an etch rate of the assistant mask layer is lower than an etch rate of the etch target layer in a process etching the etch target layer.

10. The method of claim 1, wherein the etch target layer includes at least two layers respectively including different materials from each other.

11. The method of claim 1,
further comprising:
removing the carbon layer after forming the hole;
forming a vertical active pattern in the hole;
patterning the etch target layer provided with the vertical active pattern to form a mold pattern including the vertical active pattern, the mold pattern including the insulating patterns and the sacrificial patterns alternately and repeatedly stacked;
removing the sacrificial patterns to form empty regions;
forming gate electrodes in the empty regions, respectively; and
forming a gate dielectric layer between each of the gate electrodes and the vertical active pattern.

12. The method of claim 11, wherein forming the mold pattern comprises:
forming a second carbon layer doped with boron on the etch target layer including the vertical active pattern, a top end portion of the second carbon layer having a greater boron concentration than a bottom end portion of the second carbon layer;
patterning the second carbon layer to form second openings exposing the etch target layer; and
etching the exposed etch target layer using the second carbon layer as an etch mask to form trenches and the mold pattern between the trenches.

13. A method of manufacturing a semiconductor device, comprising:
forming an etch target layer on a substrate, the etch target layer having a first thickness;
forming a carbon layer on the etch target layer that is doped with an impurity having a non-constant doping concentration profile throughout the carbon layer, the carbon layer having a second thickness less than the first thickness;
forming a mask stack on the carbon layer, the mask stack including an inorganic mask layer, an organic mask layer, and an antireflection layer and having a third thickness less than the second thickness;
patterning the mask stack to form a mask opening exposing the carbon layer;
etching the exposed carbon layer to form an opening exposing the etch target layer; and
etching the exposed etch target layer using the carbon layer as an etch mask to form a hole exposing the substrate,
wherein the doping concentration of a top end portion of the carbon layer opposite the etch target layer is different from that of the doping concentration of a bottom end portion of the carbon layer adjacent to the etch target layer.

14. The method of claim 13, wherein the impurity is boron.

15. The method of claim 13, wherein at least a portion of the doping concentration profile is substantially linear.

16. The method of claim 13, wherein the impurity doping concentration is approximately zero at a bottom surface of the carbon layer adjacent to the etch target layer.

17. The method of claim 13, wherein at least the top end portion of the carbon layer is removed during the etching process for forming the hole.

18. The method of claim 13, wherein a width of the opening in the carbon layer is increased during the etching process for forming the hole.

* * * * *